US012399629B2

(12) United States Patent
Hashimoto

(10) Patent No.: US 12,399,629 B2
(45) Date of Patent: *Aug. 26, 2025

(54) STORAGE SYSTEM HAVING A HOST THAT MANAGES PHYSICAL DATA LOCATIONS OF A STORAGE DEVICE

(71) Applicant: Kioxia Corporation, Tokyo (JP)

(72) Inventor: Daisuke Hashimoto, Cupertino, CA (US)

(73) Assignee: Kioxia Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/767,906

(22) Filed: Jul. 9, 2024

(65) Prior Publication Data
US 2024/0361922 A1   Oct. 31, 2024

Related U.S. Application Data

(60) Division of application No. 18/449,647, filed on Aug. 14, 2023, now Pat. No. 12,073,093, which is a
(Continued)

(51) Int. Cl.
G06F 3/06          (2006.01)
G06F 12/02         (2006.01)
(Continued)

(52) U.S. Cl.
CPC .......... *G06F 3/0619* (2013.01); *G06F 3/0614* (2013.01); *G06F 3/0625* (2013.01);
(Continued)

(58) Field of Classification Search
CPC .. G06F 3/0619; G06F 3/0614; G06F 12/0246; G06F 3/0625; G06F 2212/7211
See application file for complete search history.

(56) References Cited

U.S. PATENT DOCUMENTS

| 4,985,848 A | 1/1991 | Pfeiffer et al. |
| 5,950,013 A | 9/1999 | Yoshimura et al. |
| (Continued) | | |

FOREIGN PATENT DOCUMENTS

| JP | 2012203864 A | 10/2012 |
| JP | 2014026635 A | 2/2014 |
| (Continued) | | |

OTHER PUBLICATIONS

Young-Sik Lee et al., "OSSD: A Case for Object-Based Solid State Drives", MSST 2013, 43 pages.
(Continued)

Primary Examiner — Joseph D Torres
(74) Attorney, Agent, or Firm — Kim & Stewart LLP

(57) ABSTRACT

A memory system includes an interface circuit configured to connect to a host device, a controller electrically connected to the interface circuit, and a nonvolatile semiconductor memory electrically connected to the controller. The controller is configured to transmit a first response in response to a power supplied from the host device via the interface circuit, upon receipt of a first command from the host device after transmitting the first response, determine a status of data stored in the nonvolatile semiconductor memory, and transmit to the host device a second response including the determined status of the data stored in the nonvolatile semiconductor memory.

20 Claims, 23 Drawing Sheets

Related U.S. Application Data division of application No. 17/582,746, filed on Jan. 24, 2022, now Pat. No. 11,768,610, which is a continuation of application No. 16/925,258, filed on Jul. 9, 2020, now Pat. No. 11,231,856, which is a continuation of application No. 16/160,385, filed on Oct. 15, 2018, now Pat. No. 10,732,855, which is a continuation of application No. 15/253,728, filed on Aug. 31, 2016, now Pat. No. 10,101,939.

(60) Provisional application No. 62/305,890, filed on Mar. 9, 2016.

(51) Int. Cl.
*G06F 1/26* (2006.01)
*G06F 11/10* (2006.01)
*G11C 5/14* (2006.01)
*G11C 29/52* (2006.01)

(52) U.S. Cl.
CPC .......... *G06F 12/0246* (2013.01); *G06F 1/266* (2013.01); *G06F 3/0604* (2013.01); *G06F 3/064* (2013.01); *G06F 3/0659* (2013.01); *G06F 3/0665* (2013.01); *G06F 3/067* (2013.01); *G06F 3/0683* (2013.01); *G06F 3/0688* (2013.01); *G06F 11/1068* (2013.01); *G06F 2212/152* (2013.01); *G06F 2212/214* (2013.01); *G06F 2212/261* (2013.01); *G06F 2212/263* (2013.01); *G06F 2212/7201* (2013.01); *G06F 2212/7211* (2013.01); *G11C 5/144* (2013.01); *G11C 5/147* (2013.01); *G11C 5/148* (2013.01); *G11C 29/52* (2013.01); *Y02D 10/00* (2018.01)

(56) References Cited

U.S. PATENT DOCUMENTS

| | | |
|---|---|---|
| 5,963,474 A | 10/1999 | Uno et al. |
| 6,973,531 B1 | 12/2005 | Chang et al. |
| 7,103,732 B1 | 9/2006 | Chang et al. |
| 7,873,782 B2 | 1/2011 | Terry et al. |
| 8,032,724 B1 | 10/2011 | Smith |
| 8,041,878 B2 | 10/2011 | Lee |
| 8,363,349 B2 | 1/2013 | Haga et al. |
| 8,364,918 B1 | 1/2013 | Smith |
| 8,539,315 B2 | 9/2013 | Hashimoto |
| 8,631,191 B2 | 1/2014 | Hashimoto |
| 8,769,191 B2 | 7/2014 | Yun et al. |
| 8,874,872 B2 | 10/2014 | Feldman et al. |
| 8,935,302 B2 | 1/2015 | Flynn et al. |
| 8,984,375 B2 | 3/2015 | Hashimoto |
| 9,026,734 B2 | 5/2015 | Hashimoto |
| 9,026,764 B2 | 5/2015 | Hashimoto |
| 9,053,007 B2 | 6/2015 | Nishikubo |
| 9,298,534 B2 | 3/2016 | Miyamoto et al. |
| 9,996,302 B2 | 6/2018 | Hashimoto et al. |
| 2004/0080985 A1 | 4/2004 | Chang et al. |
| 2004/0177212 A1 | 9/2004 | Chang et al. |
| 2005/0185476 A1 | 8/2005 | Tachikawa |
| 2005/0240681 A1 | 10/2005 | Fujiwara et al. |
| 2007/0283428 A1 | 12/2007 | Ma et al. |
| 2008/0082736 A1 | 4/2008 | Chow et al. |
| 2009/0267638 A1 | 10/2009 | Li et al. |
| 2010/0211723 A1 | 8/2010 | Mukaida |
| 2011/0113194 A1 | 5/2011 | Terry et al. |
| 2012/0226927 A1* | 9/2012 | Kagan ............... G06F 1/3225 713/323 |
| 2012/0260150 A1 | 10/2012 | Cideciyan et al. |
| 2012/0266050 A1 | 10/2012 | Cideciyan et al. |
| 2013/0238838 A1 | 9/2013 | Fukutomi et al. |
| 2014/0215129 A1 | 7/2014 | Kuzmin et al. |
| 2014/0223213 A1* | 8/2014 | Yamazaki ............ G06F 1/3268 713/324 |
| 2014/0365719 A1 | 12/2014 | Kuzmin et al. |
| 2014/0372791 A1* | 12/2014 | Adachi ............... G06F 11/1048 714/5.1 |
| 2015/0067415 A1 | 3/2015 | Miyamoto et al. |
| 2015/0074371 A1 | 3/2015 | Hashimoto et al. |
| 2015/0089179 A1 | 3/2015 | Kurita et al. |
| 2015/0095546 A1 | 4/2015 | Bennett et al. |
| 2015/0121099 A1* | 4/2015 | Cheong ............... G06F 1/3287 713/320 |
| 2015/0143032 A1 | 5/2015 | Hashimoto |
| 2015/0331624 A1 | 11/2015 | Law |
| 2015/0347025 A1 | 12/2015 | Law |
| 2016/0034354 A1 | 2/2016 | Hashimoto et al. |
| 2016/0092352 A1 | 3/2016 | Camp et al. |
| 2016/0283125 A1 | 9/2016 | Hashimoto et al. |
| 2017/0075610 A1 | 3/2017 | Choi et al. |

FOREIGN PATENT DOCUMENTS

| | | |
|---|---|---|
| WO | 2014039845 A1 | 3/2014 |
| WO | 2014039922 A2 | 3/2014 |
| WO | 2014147865 A1 | 9/2014 |

OTHER PUBLICATIONS

Matias Bjorling, "Open-Channel Solid State Drives", Vault, Mar. 12, 2015, 22 pages.
Matias Bjorling, "Linux Kernel Abstractions for Open-Channel Solid State Drives", Non-Volatile Memories Workshop, Mar. 1, 2015, 10 pages.
NVM Express, Revision 1.2, Nov. 3, 2014, 205 pages.
Storage Intelligence Proposal, Revision 6, Mar. 10, 2015, 56 pages.
Shin-Ichi Kanno et al., "Theoretical Write Amplification Analysis of the SSD", Technical Report of IEICE, Oct. 10, 2014, 2 pages.
Andrea C. Arpaci-Dusseau et al., "Removing the Costs of Indirection in Flash-Based SSDs with Nameless Writes", USENIX HotStorage 2010, Jun. 22, 2010, 32 pages.
Yiying Zhang et al, "De-indirection for Flash-Based SSDs with Nameless Writes", USENIX FAST 2012, Feb. 7, 2012, 16 pages.
Robert E. Novak, "ZFS on SMR Drives, Enabling Shingled Magnetic Recording (SMR) for Enterprises", Jun. 2, 2014, 26 pages.
Chao Jin et al., "HiSMRFs—A File System for Shingled Storage Array", MSST 2014, Jun. 5, 2014, 23 pages.
Chao Jin et al., "HiSMRFs: A High Performance File System for Shingled Storage Array", IEEE, 2014, 6 pages.
Abutalib Aghayev et al., "Skylight—A Window on Shingled Disk Operation", USENIX FAST 2015, Feb. 17, 2015, 46 pages.
Mary Dunn, "Shingled Magnetic Recording Models, Standardization, and Applications", SNIA Education, 2014, 44 pages.

\* cited by examiner

FIG. 12

Block mapping table 46

Free block table 461

| Block address | Erase count |
|---|---|
| ... | ... |
| ... | ... |
| ... | ... |
| ... | ... |

Active block table 462

| Block address | Erase count |
|---|---|
| ... | ... |
| ... | ... |
| ... | ... |
| ... | ... |

Bad block table 463

| Block address | Erase count |
|---|---|
| ... | ... |
| ... | ... |
| ... | ... |

Input block table 464

| Block address | Page address to be written | Erase count |
|---|---|---|
| ... | ... | ... |
| ... | ... | ... |
| ... | ... | ... |
| ... | ... | ... |

STORAGE SYSTEM HAVING A HOST THAT MANAGES PHYSICAL DATA LOCATIONS OF A STORAGE DEVICE

CROSS-REFERENCE TO RELATED APPLICATIONS

This application is a divisional of U.S. patent application Ser. No. 18/449,647, filed Aug. 14, 2023, which is a divisional of U.S. patent application Ser. No. 17/582,746, filed on Jan. 24, 2022, now U.S. Pat. No. 11,768,610, issued Sep. 26, 2023, which application is a continuation of U.S. patent application Ser. No. 16/925,258, filed on Jul. 9, 2020, now U.S. Pat. No. 11,231,856, issued Jan. 25, 2022, which application is a continuation of U.S. patent application Ser. No. 16/160,385, filed on Oct. 15, 2018, now U.S. Pat. No. 10,732,855, issued Aug. 4, 2020, which application is a continuation of U.S. patent application Ser. No. 15/253,728, filed on Aug. 31, 2016, now U.S. Pat. No. 10,101,939, issued Oct. 16, 2018, which application is based upon and claims the benefit of priority from U.S. Provisional Patent Application No. 62/305,890, filed on Mar. 9, 2016, the entire contents of which are incorporated herein by reference.

FIELD

The present disclosure relates to a storage system, in particular, a storage system having a host that directly manages physical data locations of storage device.

BACKGROUND

A storage system typically includes a storage device including memory such as semiconductor memory, and a host that uses the storage device for storing data. Conventionally, such a storage device includes a controller, and the controller manages data storage in the memory so as to reliably store data received from the host. On the other hand, it may be desirable for the host to more actively participate in the management of the data storage in the memory. This is because the controller may be already carrying out an operation on its own initiative when the host instructs the controller to perform a certain operation, and the instructed operation may not be timely performed by the controller until the controller completes the already-started operation.

DESCRIPTION OF THE DRAWINGS

FIG. 12 illustrates a block mapping table employed in the storage device according to the embodiment.

DETAILED DESCRIPTION

According to an embodiment, a memory system includes an interface circuit configured to connect to a host device, a controller electrically connected to the interface circuit, and a nonvolatile semiconductor memory electrically connected to the controller. The controller is configured to transmit a first response in response to a power supplied from the host device via the interface circuit, upon receipt of a first command from the host device after transmitting the first response, determine a status of data stored in the nonvolatile semiconductor memory, and transmit to the host device a second response including the determined status of the data stored in the nonvolatile semiconductor memory.

Details of the present disclosure are described below with reference to drawings.

Storage System

Figure 1:
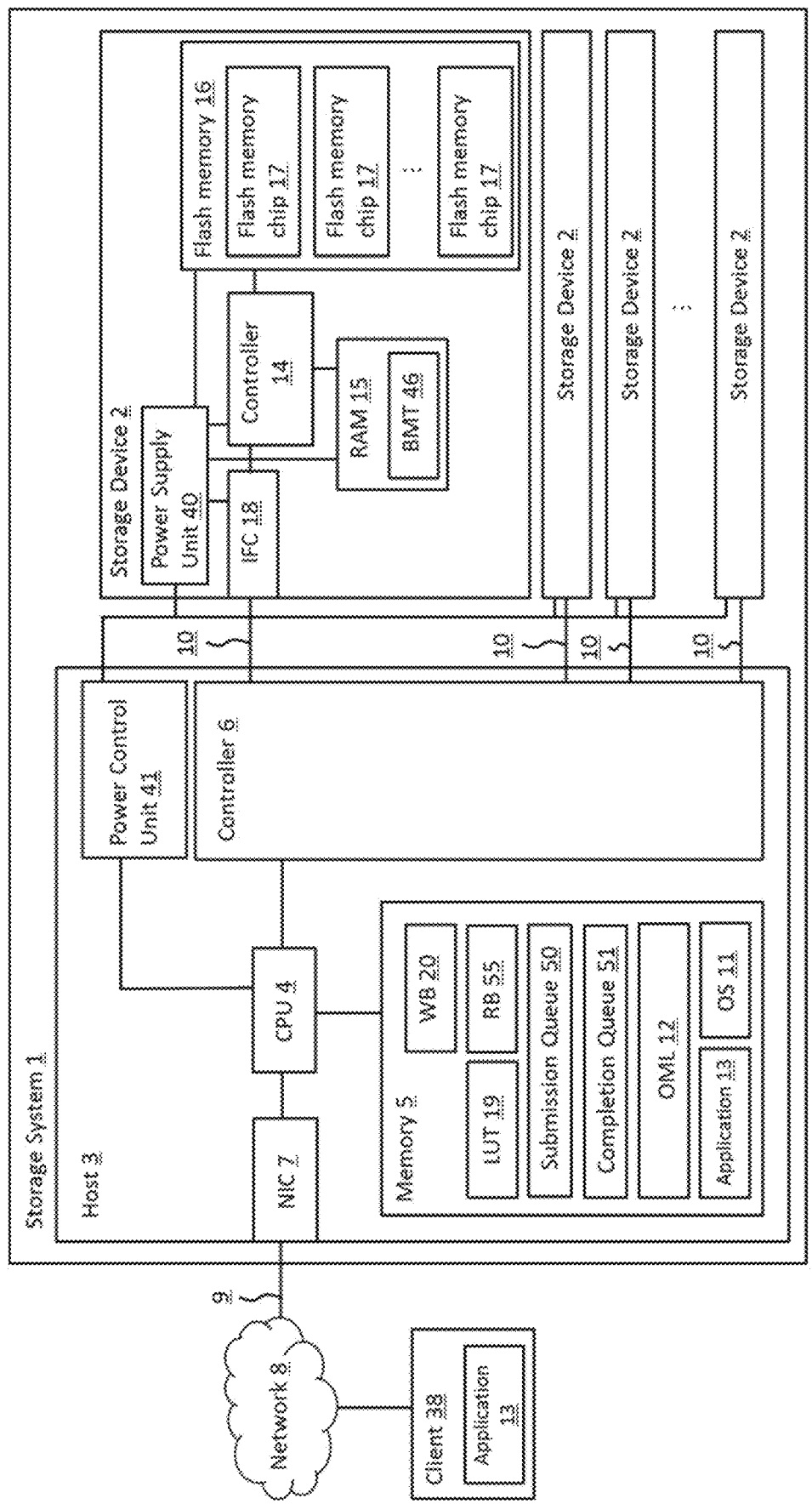
FIG. 1 is a block diagram of a storage system according to an embodiment.

FIG. 1 is a block diagram of a storage system according to an embodiment. In the present embodiment, a storage system 1 is communicably connected to a client (client device) 38 via a network 8. The storage system 1 includes a host (host device) 3, one or more storage devices 2, and an interface 10 connecting the host 3 and each of the storage devices 2.

The host 3 is an example of a processing device. The host 3 includes a central processing unit (CPU) 4, a memory 5, a controller 6, a network interface controller (NIC) 7, and a power control unit 41. The CPU 4 is an example of a processor. The memory 5 is an example of a storage module.

The NIC 7 performs transmission and reception of data, information, signals, commands, addresses and the like to and from an external device such as the client 38 via a network interface 9. The network interface 9 uses a protocol such as, for example, Ethernet®, InfiniBand, Fiber Channel, Peripheral Component Interconnect Express (PCIe) Fabric, Wireless Fidelity (Wi-Fi), and the like.

The CPU 4 is included in the host 3, and performs various calculations and control operations in the host 3. The CPU 4 executes, for example, an operating system (OS) 11 loaded from one of the storage devices 2 to the memory 5.

The CPU 4 is connected to the controller 6 by an interface using a protocol such as PCI Express. The CPU 4 performs controls of the storage devices 2 via the controller 6.

The controller 6 controls each storage device 2 in accordance with instructions of the CPU 4. The controller 6 is a PCIe Switch in the present embodiment. Instead, a serial attached SCSI (SAS) expander, a PCIe expander, a RAID controller, a JBOD controller, or the like may be used as the controller 6.

The memory 5 temporarily stores a program and data and functions as an operational memory of the CPU 4. The memory 5 includes, for example, a dynamic random access memory (DRAM), a magnetoresistive random access memory (MRAM), a resistive random access memory (ReRAM), and a ferroelectric random access memory (FeRAM).

The memory 5 includes a write buffer memory 20, a read buffer memory 55, an LUT 19, a submission queue 50, a completion queue 51, memory regions for storing the OS 11, an object management layer (OML) 12, and an application software layer 13.

The write buffer memory 20 temporarily stores write data. The read buffer memory 55 temporarily stores read data. The LUT 19 is used to manage a mapping between object IDs or file names of data and physical addresses of flash memories 16 in the storage devices 2 and the write buffer memory 20.

The submission queue 50 stores, for example, a command or request to the CPU 4 or a command or request to the storage devices 2. When the command or request transmitted to the storage devices 2 is completed, the completion queue 51 stores information indicating completion of the command or request and information related to the completion.

The OS 11 is a program for managing the host 3, and operates to manage an input to and an output from the host 3, the storage devices 2, so that software running on the OS 11 can use components in the storage system 1, including the storage devices 2.

The OML 12 operates to control a manner of data writing into the storage device 2 and data reading from the storage device 2. The OML 12 employs, for example, an object storage system. Alternatively, the OML 12 may employ a file system or a key value store system.

The application software layer 13 transmits to the storage devices 2 a request initiated by the host 3 and/or the client 38.

The power control unit 41 receives power supplied from an outside of the host 3 and supplies power to each of the storage devices 2. The power control unit 41 is connected to the CPU 4 through a signal line, and switches power supply to each of the storage devices 2 based on a control signal from the CPU 4.

The storage device 2 includes, for example, a solid-state drive (SSD), which is a non-volatile storage device. Alternatively, the storage device 2 can include other storage devices such as a hard disk drive (HDD), a hybrid drive, an SD card, a universal serial bus (USB) flash drive, an embedded multimedia card (eMMC), and a memory node.

The storage devices 2 communicate with the host 3 via the interface 10. In the present embodiment, the interface 10 uses the PCIe protocol as a lower protocol layer and an NVM Express protocol as an upper protocol layer. Alternatively, the interface 10 can use any other technically feasible protocol, such as SAS, USB, serial advanced technology attachment (SATA), Fiber Channel, or the like.

The storage device 2 includes a controller 14, a random access memory (RAM) 15, a non-volatile semiconductor memory, such as a NAND flash memory 16 (hereinafter flash memory), an interface controller (IFC) 18, and a power supply unit 40.

The controller 14 manages and controls the RAM 15, the flash memory 16, and the IFC 18. The controller 14 manages physical blocks of the flash memory 16 using a block mapping table (BMT) 46 including an input block table, a free block table, an active block table, and a bad block table. That is, the BMT 46 is used to manage a mapping of physical block addresses of input blocks, active blocks, free blocks, and bad blocks.

The RAM 15 may be a semiconductor memory, and includes an area storing the BMT 46. The RAM 15 may be, for example, a volatile RAM, such as a DRAM and a static random access memory (SRAM), or a non-volatile RAM, such as a FeRAM, an MRAM, a phase-change random access memory (PRAM), and a ReRAM. The RAM 15 may be embedded in the controller 14.

The flash memory 16 includes one or more flash memory chips 17 and stores user data designated by the host 3 in one or more of the flash memory chips 17. The controller 14 and the flash memory 16 are connected via a flash memory interface 21, such as Toggle and ONFI. In the present embodiment, the flash memory 16 is employed as a non-volatile storage medium of the storage device 2, but other type of storage medium such as spinning disk of HDD can be employed.

The IFC 18 performs transmission and reception of signals to and from the host 3 via the interface 10.

The power supply unit 40 receives power supplied from the power control unit 41 of the host 3 and supplies power to each element of the storage device 2 including the controller 14, the RAM 15, the flash memory 16, and the IFC 18. The power supply unit 40 generates various voltages by stepping up or down the voltage supplied from the power control unit 41 and supplies the generated voltages to the elements of the storage device 2.

According to the present embodiment, the storage device 2 does not have a flash translation layer (FTL) to manage a mapping between a logical address such as a logical block address (LBA) and a physical address of the flash memory 16. Instead, the host 3 manages the mapping using the LUT 19.

Figure 2:
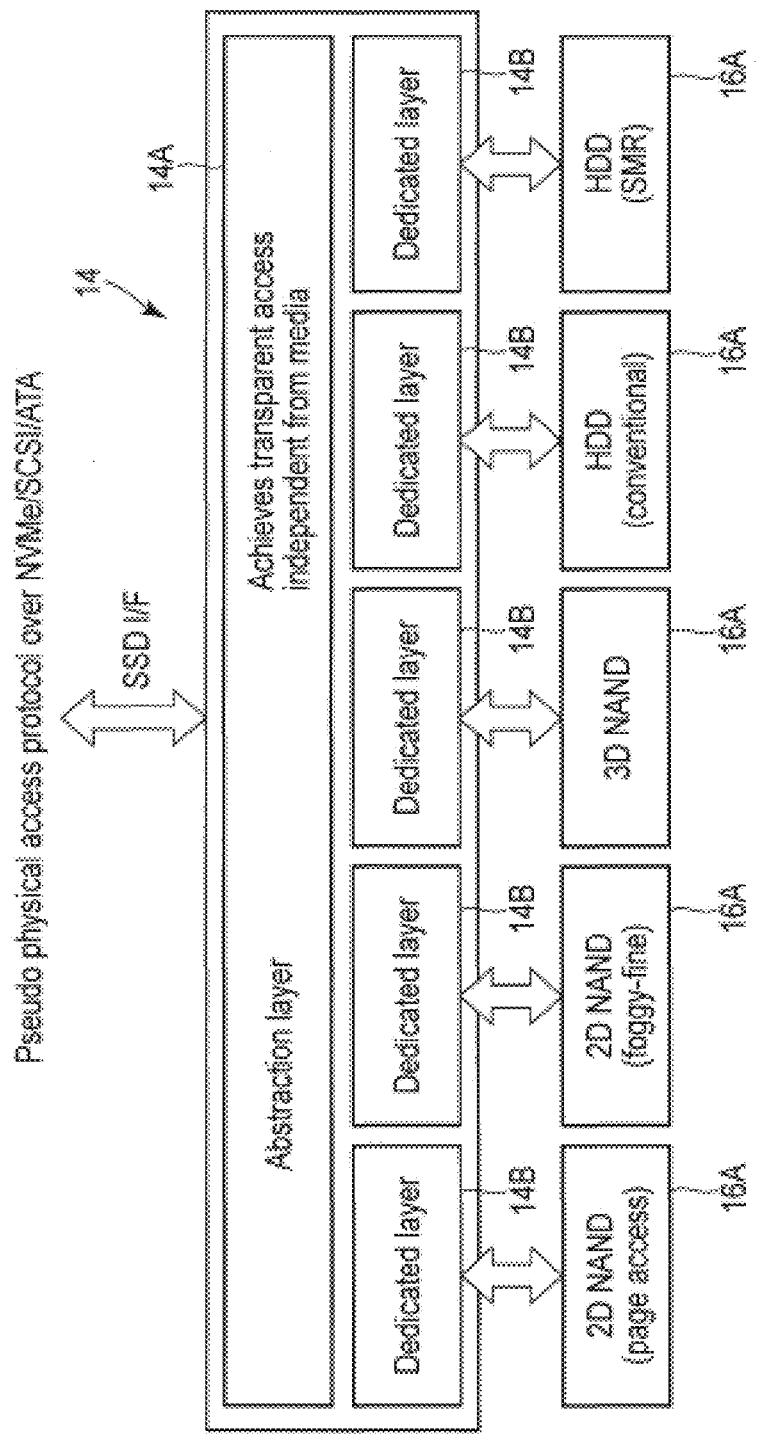
FIG. 2 is a block diagram of a storage device in the storage system, focusing on a relationship between a controller thereof and non-volatile storage media of various types that can be mounted in the storage device.

FIG. 2 is a block diagram of the storage device 2, focusing on a relationship between the controller 14 and non-volatile storage media 16A of various types that can be mounted in the storage device 2.

The controller 14 includes, for example, an abstraction layer 14A as a front end and at least one dedicated layer 14B as a back end. As described above, the controller 14 of the storage device 2 does not have the FTL to manage the mapping between the logical address such as the LBA and the physical address such as the physical block address (PBA).

The abstraction layer 14A manages blocks (or zones) of a non-volatile storage medium 16A, e.g., the flash memory 16, and processes commands received from the host 3. For example, the abstraction layer 14A manages block mapping of four types of blocks, i.e., an input block, active blocks, free bocks, and bad blocks, based on a physical address abstracted by the dedicated layer 14B corresponding to the flash memory 16.

Each of the dedicated layers 14B performs control dedicated to the corresponding non-volatile storage medium 16A and transmission and reception of commands to and from the non-volatile storage medium 16A. For example, one of the dedicated layers 14B controls the flash memory 16 and performs transmission and reception of commands to and from the flash memory 16. The non-volatile storage medium 16A is not limited to the flash memory 16, which includes, for example, 2D NAND memory of page access, 2D NAND memory of foggy-fine access, and 3D NAND memory, and may be a different type of non-volatile storage medium 16A, such as an HDD, a shingled magnetic recording (SMR) HDD, and a combination of different types of non-volatile storage medium 16A.

Figure 3:
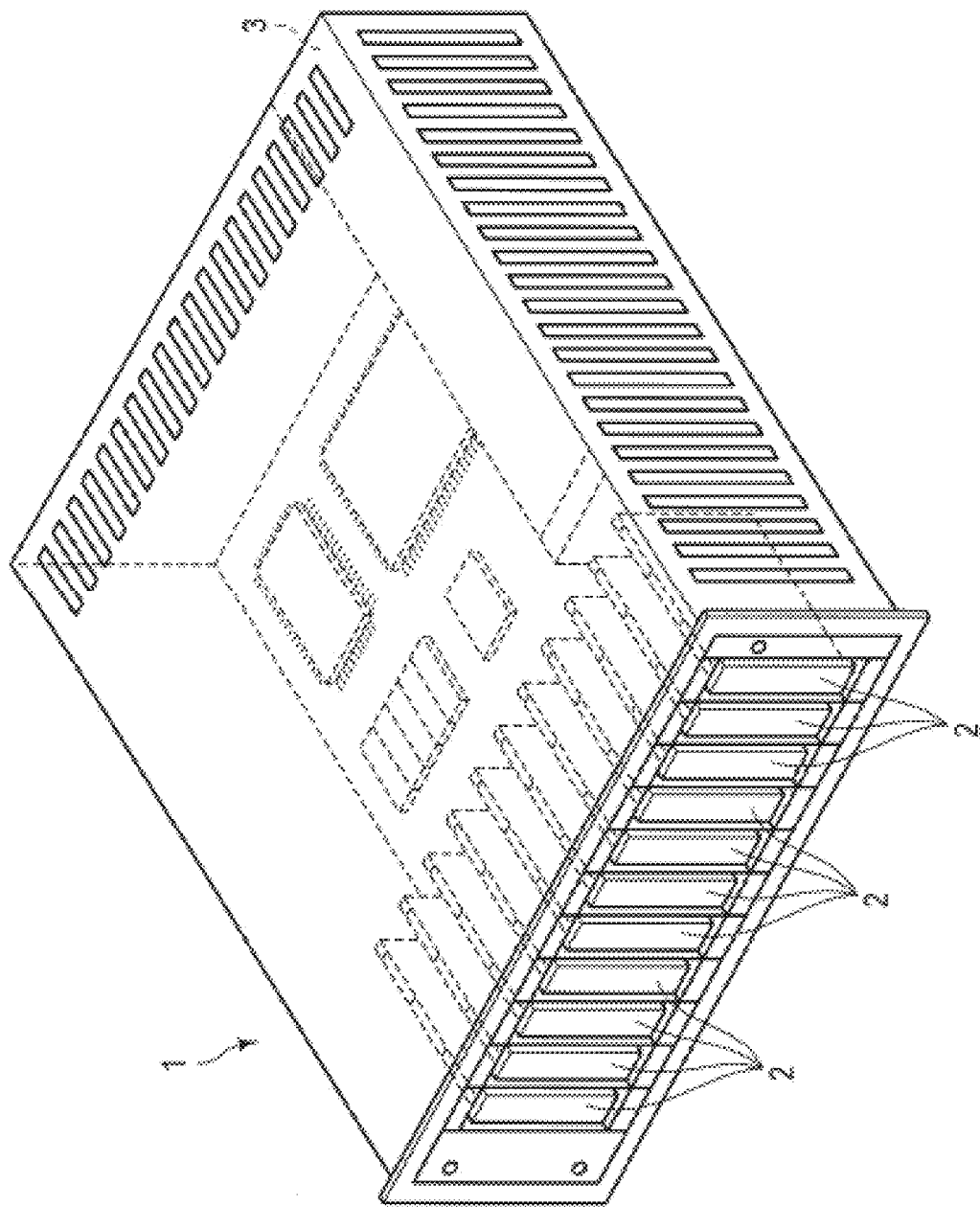
FIG. 3 is a perspective view of the storage system according to the embodiment.

FIG. 3 is a perspective view of the storage system 1 according to the present embodiment. As the storage system 1, for example, the host 3 and the storage devices 2 are accommodated in an enclosure (case) having a shape of a rectangular parallelepiped and disposed adjacent to each other.

Figure 4:
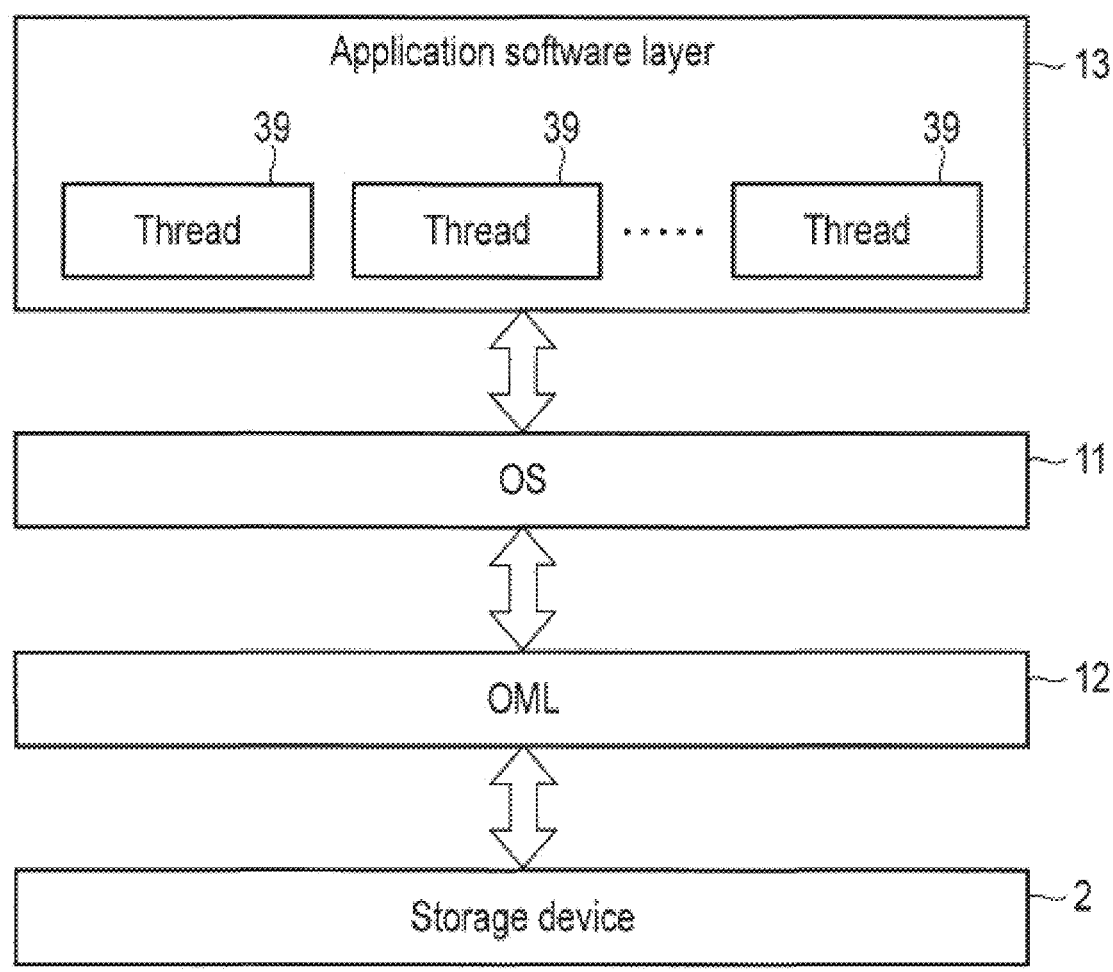
FIG. 4 illustrates a software layer structure of the storage system according to the embodiment.

FIG. 4 illustrates a software layer structure of the storage system 1 according to the present embodiment.

In the application software layer 13 loaded in the memory 5 and/or the client 38, a variety of application software threads 39 is executed by the CPU 4 (or a CPU of the client 38). The application software threads 39 may include, for example, client software, database software, a distributed storage system, a virtual machine (VM), a guest OS, and analytics software.

The application software layer 13 communicates with the storage device 2 through the OS 11 and the OML 12 loaded in the memory 5 and executed by the CPU 4 (or a CPU of the client 38). When the application software layer 13 operates to transmit to the storage device 2 a request initiated by the host 3 and/or the client 38, the application software layer 13 first operates to transmit the request to the OS 11, and then the OS 11 operates to transmit the request to the OML 12.

Then, the OML 12 operates to transmit a command corresponding to the request and data associated with the request (e.g., if the request is a write request) to the storage device 2 via the interface 10. Also the OML 12 operates to specify one or more physical addresses of the flash memory 16 corresponding to the request, and then transmit a command and the one or more physical addresses to the storage device 2 via the interface 10.

Upon receiving a response from the storage device 2, the OML 12 operates to transmit a response to the OS 11, and then the OS 11 operates to transmit the response to the application software layer 13.

For example, during a write operation, the application software layer 13 operates to transmit a write command, an object ID, and write data, to the OS 11. The OS 11 operates to transmit the write command, the object ID, and the write data, to the OML 12. The OML 12 operates to transmit the write command, the write data, and size information of the write data to the storage device 2 without performing address translation. The controller 14 of the storage device 2 writes the write data into the flash memory 16 and transmits a physical address of the flash memory 16 into which the write data are written to the OML 12. The OML 12 operates to associate the object ID with the physical address, updates the LUT 19, and transmits a response (e.g., write acknowledgement) to the OS 11. The OS 11 operates to transmit the response to the application software layer 13.

For example, during a read operation, the application software layer 13 operates to transmit a read command and an object ID to the OS 11. Then, the OS 11 operates to transmit the read command and the object ID to the OML 12. The OML 12 operates to convert the object ID to a physical address by referring to the LUT 19 and transmits the read command and the physical address to the storage device 2. The controller 14 of the storage device 2 reads data (read data) from the physical address of the flash memory 16 and transmits the read data to the OML 12. Then, the OML 12 operates to transmit the read data to the OS 11, and the OS 11 operates to transmit the read data to the application software layer 13.

Flash Memory Chip

Figure 5:
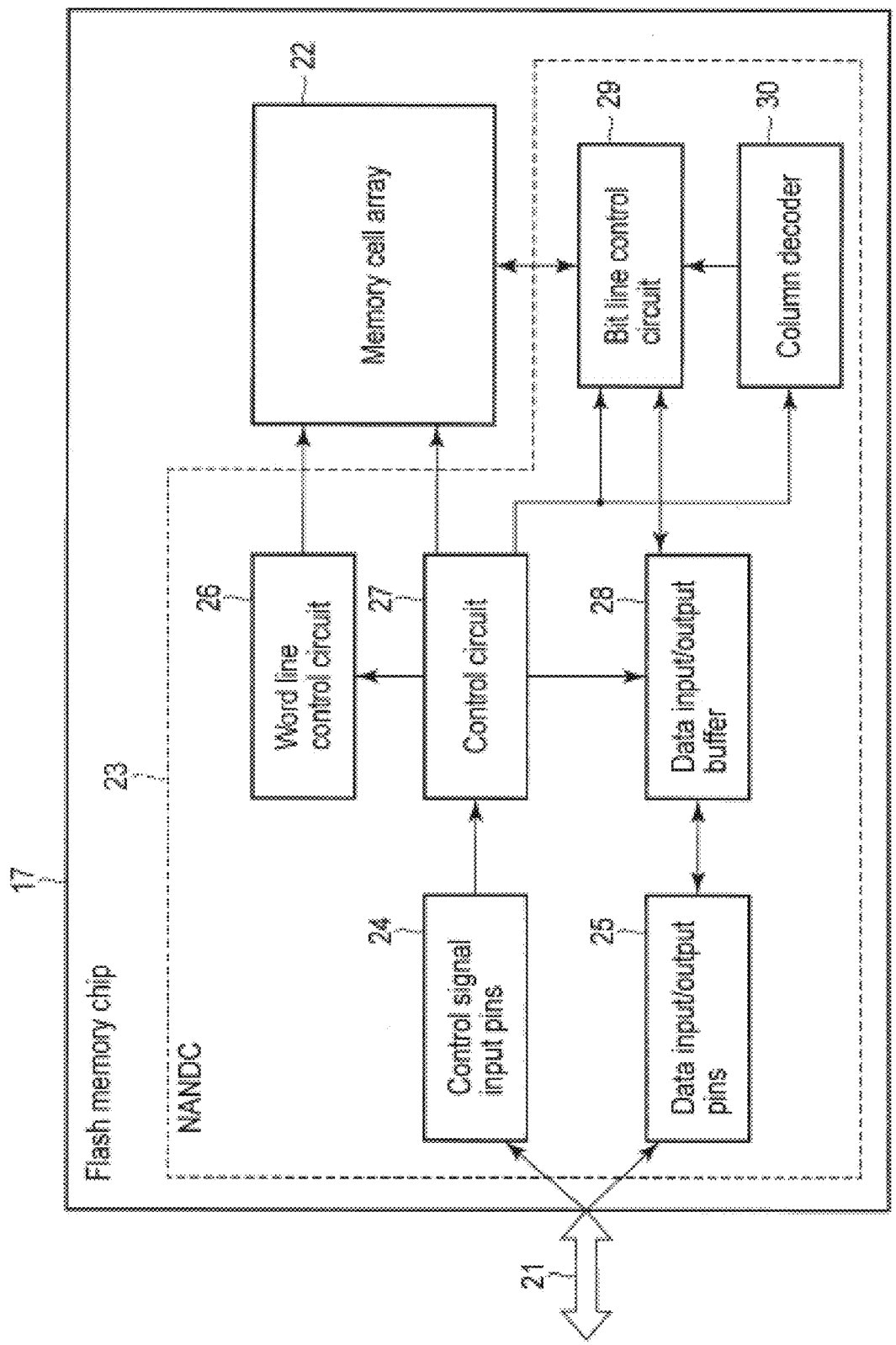
FIG. 5 is a block diagram of a flash memory chip in the storage device.

FIG. 5 is a block diagram of the flash memory chip 17 according to the present embodiment. The flash memory chip 17 includes a memory cell array 22 and a NAND controller (NANDC) 23.

The NANDC 23 is a controller configured to control access to the memory cell array 22. The NANDC 23 includes control signal input pins 24, data input/output pins 25, a word line control circuit 26, a control circuit 27, a data input/output buffer 28, a bit line control circuit 29, and a column decoder 30.

The control circuit 27 is connected to the control signal input pins 24, the word line control circuit 26, the data input/output buffer 28, the bit line control circuit 29, and the column decoder 30, and controls these circuit components of the NANDC 23.

The memory cell array 22 includes a plurality of memory cells arranged in a matrix configuration, each of which stores data, as described below in detail.

Also, the memory cell array 22 is connected to the word line control circuit 26, the control circuit 27, and the bit line control circuit 29. Further, the control signal input pins 24 and the data input/output pins 25 are connected to the controller 14 of the storage device 2, through the flash memory interface 21.

When data are read from the flash memory chip 17, data in the memory cell array 22 are output to the bit line control circuit 29 and then temporarily stored in the data input/output buffer 28. Then, the read data are transferred to the controller 14 of the storage device 2 from the data input/output pins 25 through the flash memory interface 21. When data are written to the flash memory chip 17, data to be written (write data) are input to the data input/output buffer 28 through the data input/output pins 25. Then, the write data are transferred to the column decoder 30 through the control circuit 27, and input to the bit line control circuit 29 by the column decoder 30. The write data are written to memory cells of the memory cell array 22 according to a timing controlled by the word line control circuit 26 and the bit line control circuit 29.

When first control signals are input to the flash memory chip 17 from the controller 14 of the storage device 2 through the flash memory interface 21, the first control signals are input through the control signal input pins 24 into the control circuit 27. Then, the control circuit 27 generates second control signals, according to the first control signals from the controller 14, and controls voltages for controlling the memory cell array 22, the bit line control circuit 29, the column decoder 30, the data input/output buffer 28, and the word line control circuit 26. Here, a circuit section that includes the circuits other than the memory cell array 22 in the flash memory chip 17 is referred to as the NANDC 23.

Figure 6:
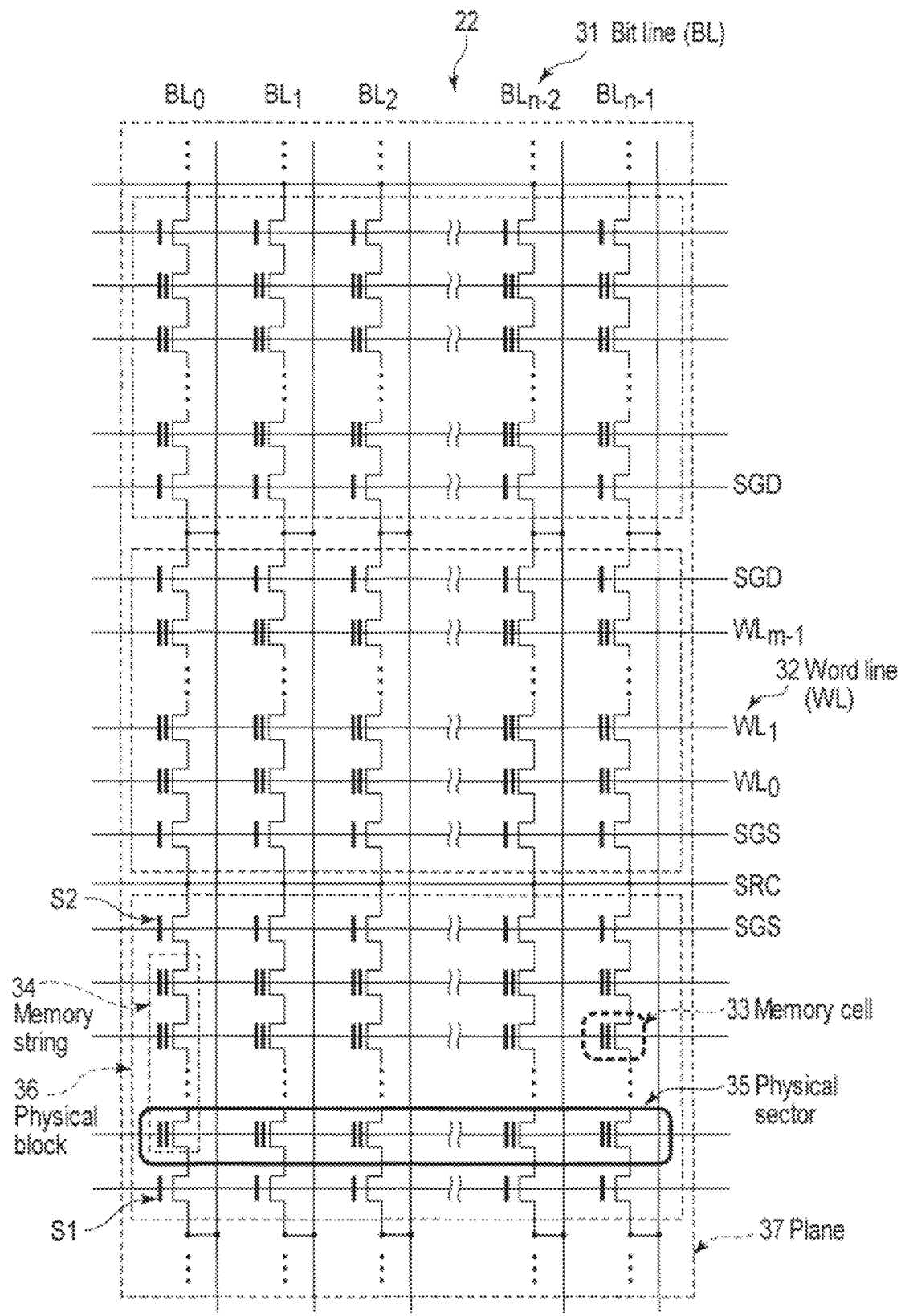
FIG. 6 illustrates a detailed circuit structure of a memory cell array in the flash memory chip.

FIG. 6 illustrates a detailed circuit structure of the memory cell array 22 according to the present embodiment. The memory cell array 22 includes one or more planes 37. Each plane 37 includes a plurality of physical blocks 36, and each physical block 36 includes a plurality of memory strings (MSs) 34. Further, each of the MSs 34 includes a plurality of memory cells 33.

The memory cell array 22 further includes a plurality of bit lines 31, a plurality of word lines 32, and a common source line. The memory cells 33, which are electrically data-rewritable, are arranged in a matrix configuration at intersections of bit lines 31 and the word lines 32. The bit line control circuit 29 is connected to the bit lines 31 and the word line control circuit 26 is connected to the word lines 32, so as to control data writing and reading with respect to the memory cells 33. That is, the bit line control circuit 29 reads data stored in the memory cells 33 via the bit lines 31 and applies a write control voltage to the memory cells 33 via the bit lines 31 and writes data in the memory cells 33 selected by the word line 32.

In each MS 34, the memory cells 33 are connected in series, and selection gates S1 and S2 are connected to both ends of the MS 34. The selection gate S1 is connected to the bit line 31 and the selection gate S2 is connected to a source line SRC. Control gates of the memory cells 33 arranged in the same row are connected in common to one of the word lines 32 WL0 to WLm−1. First selection gates S1 are connected in common to a select line SGD, and second selection gates S2 are connected in common to a select line SGS.

A plurality of memory cells 33 connected to one word line 32 configures one physical sector 35. Data are written and read for each physical sector 35. In the one physical sector 35, data equivalent to two physical pages (two pages) are stored when a two-bits-per-cell (four-level) write system (multi-level cell) is employed, and data equivalent to one physical page (one page) are stored when a one-bit-per-cell (two-level) write system (single-level cell) is employed. Further, when a three-bits-per-cell (eight-level) write system (triple-level cell) is employed, data equivalent to three physical pages (three pages) are stored in the one physical sector 35. Further, data are erased in a unit of the physical block 36.

During a write operation, a read operation, and a program verify operation, one word line WL is selected according to a physical address, such as a row address, received from the controller 14, and, as a result, one physical sector 35 is selected. Switching of a page in the selected physical sector 35 is performed according to a physical page address in the physical address. In the present embodiment, the flash memory 16 employs the two-bits-per-cell write method, and the controller 14 controls the physical sector 35, recognizing that two pages, i.e., an upper page and a lower page, are allocated to the physical sector 35, as physical pages. A physical address may include physical page addresses and physical block address. A physical page address is assigned to each of the physical pages, and a physical block address is assigned to each of the physical blocks 36.

The four-level NAND memory of two bits per cell is configured such that a threshold voltage in one memory cell could have four kinds of distributions.

Figure 7:
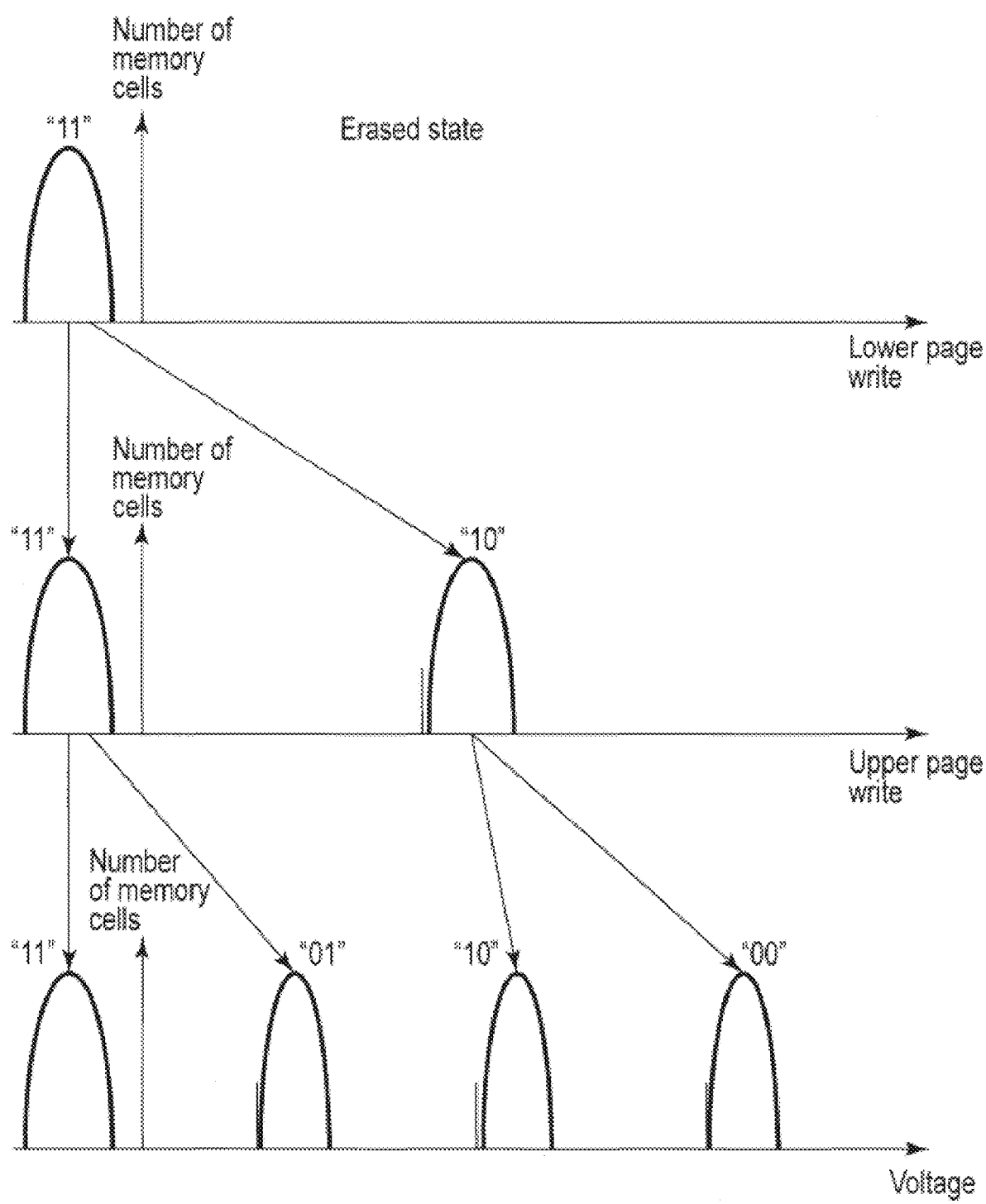
FIG. 7 illustrates a relation between two-bit four-level data stored in a memory cell of a four-level NAND cell type.

FIG. 7 illustrates a relation between two-bit four-level data (11, 01, 10, and 00) stored in a memory cell 33 of a four-level NAND cell type. Two-bit data of one memory cell 33 includes lower page data and upper page data. The lower page data and the upper page data are written into the memory cell 33 according to separate write operations, i.e., two write operations. Here, when data are represented as "XY," "X" represents the upper page data and "Y" represents the lower page data. An erased state is represented by "00".

Each of the memory cells 33 includes a memory cell transistor, for example, a metal oxide semiconductor field-effect transistor (MOSFET) having a stacked gate structure formed on a semiconductor substrate. The stacked gate structure includes a charge storage layer (floating gate electrode) formed on the semiconductor substrate via a gate insulating film and a control gate electrode formed on the floating gate electrode via an inter-gate insulating film. A threshold voltage of the memory cell transistor changes according to the number of electrons accumulated in the floating gate electrode. The memory cell transistor stores data according to difference in the threshold voltage.

In the present embodiment, each of the memory cells 33 employs a write system of a four-level store method for two bits per cell (MLC), using an upper page and a lower page. Alternatively, the memory cells 33 may employ a write system of a two-level store method of one bit per cell (SLC), using a single page, an eight-level store method for three bits per cell (TLC), using an upper page, a middle page, and a lower page, or a multi-level store method for four bits per cell (quad-level cell) or more, or mixture of them. The memory cell transistor is not limited to the structure including the floating gate electrode and may be a structure such as a metal-oxide-nitride-oxide-silicon (MONOS) type that can adjust a threshold voltage by trapping electrons on a nitride interface functioning as a charge storage layer. Similarly, the memory cell transistor of the MONOS type can be configured to store data of one bit or can be configured to store data of a multiple bits. The memory cell transistor can be, as a non-volatile storage medium, a semiconductor storage medium in which memory cells are three-dimensionally arranged.

Address Structure

Figure 8:
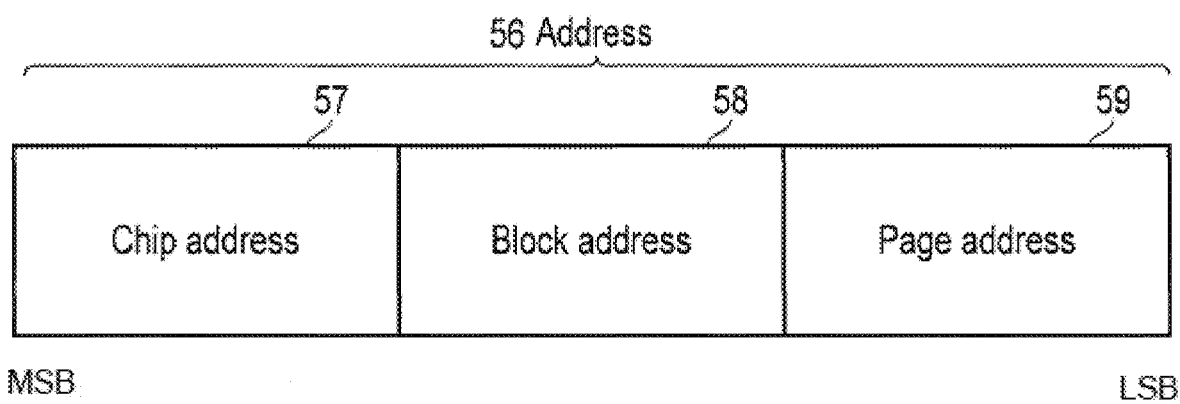
FIG. 8 illustrates a first example of an address configuration of a physical address.

FIG. 8 illustrates a first example of an address configuration of a physical address according to the present embodiment. A physical address 56 is transmitted via the interface 10 as a form of the address structure shown in FIG. 8, when the OS 11 operates to access the storage device 2. The physical address 56 includes a chip address 57, a block address 58, and a page address 59. In the present embodiment, the chip address 57 is located at the most significant bit (MSB) side of the address structure, and the page address 59 is located at the least significant bit (LSB) side of the address structure. However, the locations of the chip address 57, the block address 58, and the page address 59 in the physical address can be determined arbitrarily.

Figure 9:
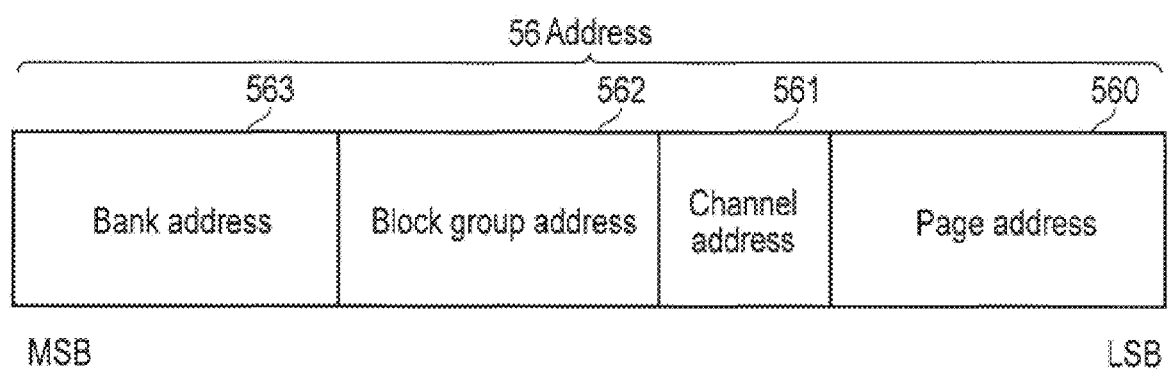
FIG. 9 illustrates a second example of an address configuration of a physical address.

FIG. 9 illustrates a second example of the configuration of the physical address 56 according to the present embodiment. The physical address 56 includes a bank address 563, a block group address 562, a channel address 561, and a page address 560. The bank address 563 corresponds to the chip address 57 in FIG. 8. The block group address 562 corresponds to the block address 58 in FIG. 8. The channel address 561 and the page address 560 correspond to the page address 59 in FIG. 8.

Figure 10:
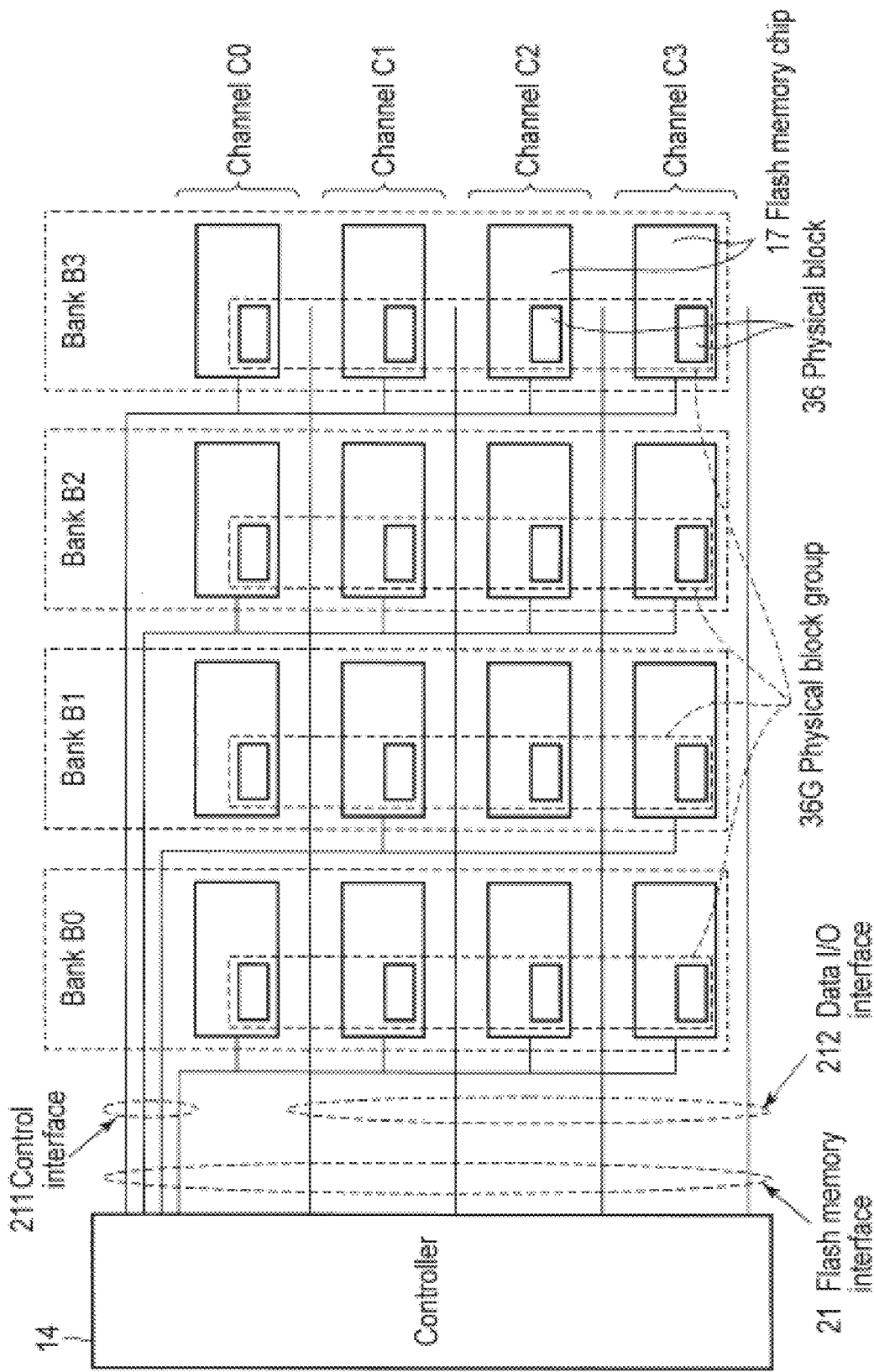
FIG. 10 is a block diagram of the storage device showing connection between a controller and a plurality of flash memory chips.

FIG. 10 illustrates a configuration of the flash memory 16 according to the present embodiment and elements corresponding to each of the addresses shown in FIG. 9. In FIG. 10, the plurality of flash memory chips 17 are specified by channel groups C0-C3 and bank groups B0-B3, which intersect with each other. The flash memory interface 21 between the controller 14 and the flash memory chip 17 includes a plurality of data I/O interfaces 212 and a plurality of control interfaces 211. Flash memory chips 17 that share a common data I/O interface 212 belong to a common channel group. Similarly, flash memory chips 17 that share a common bus of the control interface 211 belong to a common bank group.

According to this sharing of the bus, a plurality of flash memory chips 17 that belong to the same bank group can be accessed in parallel through driving of the plurality of channels. Also, the plurality of banks can be operated in parallel through an interleave access. The controller 14 fetches, from the submission queue 50, a command to access a bank in an idle state with priority to a command to access a busy bank, in order to perform a more efficient parallel operation. For example, the controller 14 fetches a command from the submission queue 50 in an interleaved manner, and if the command is for an access to a bank in a busy state, fetching of the command is postponed until the state of the bank changes to an idle state. Physical blocks 36 that belong to the same bank and are associated with the same physical block address belong to the same physical block group 36G, and assigned a physical block group address corresponding to the physical block address.

In an embodiment, the physical block group 36G of the plurality of physical blocks 36 is set as a unit of erasing data, and the physical block group address is set as a management unit in the block mapping table (BMT) 46. As a result, the size of the BMT 46 can be reduced, and the size of the RAM 15 can be reduced. More specifically, the size of the BMT 46 that is loaded when the storage device 2 is booted can be reduced, and as a result, the boot time of the storage device 2 can be shortened.

Block Mapping

Figure 11:
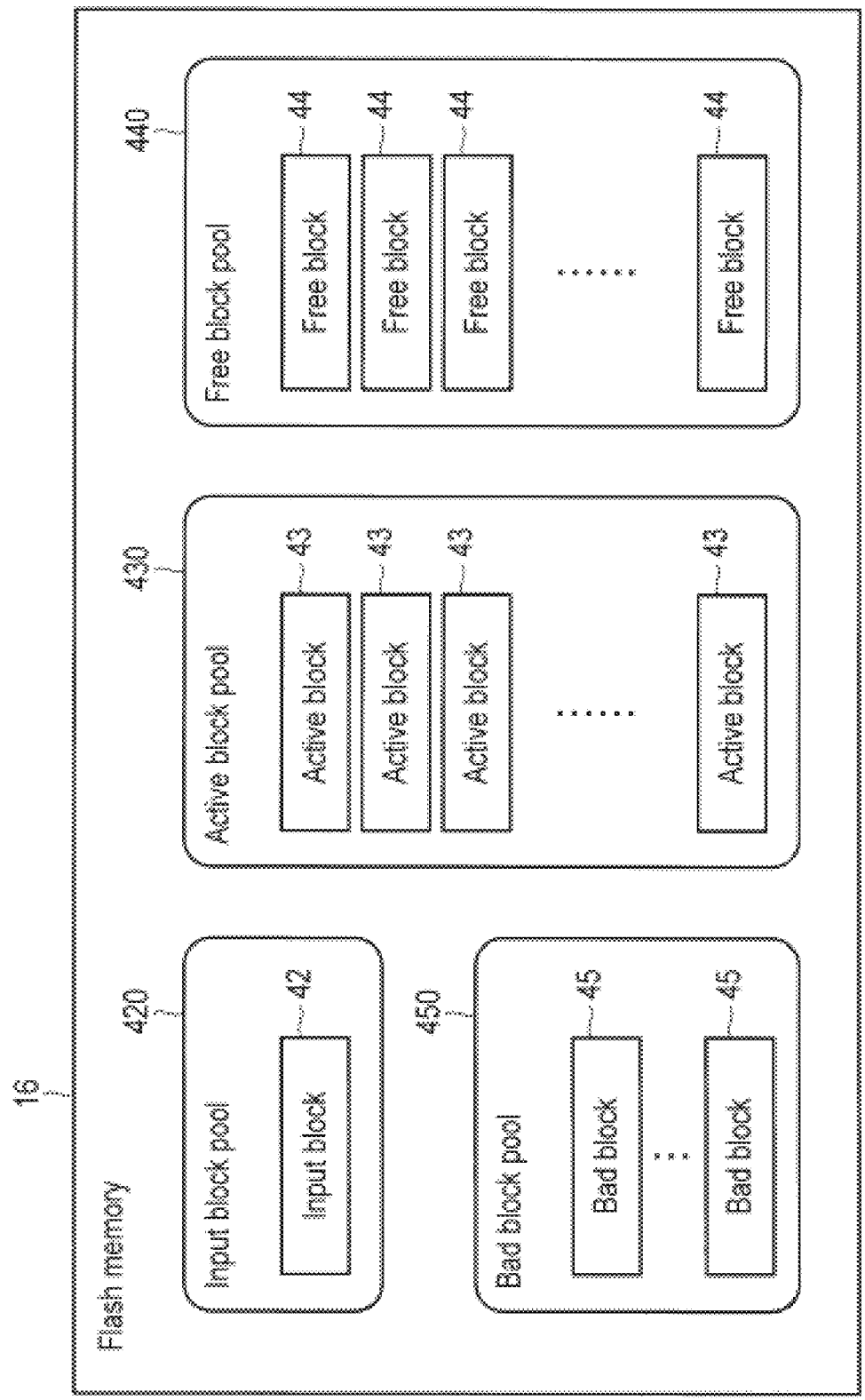
FIG. 11 illustrates an overview of a mapping of physical blocks based on block pools according to the embodiment.

FIG. 11 illustrates an overview of the mapping of physical blocks based on block pools in the present embodiment. As described above, the mapping is managed using the BMT 46 stored in the RAM 15. The block pools include an input block pool 420, an active block pool 430, a free block pool 440, and a bad block pool 450. The mappings of physical blocks are managed by the controller 14, and when a physical block is remapped into a different block pool, the controller updates the mappings in the BMT 46. The controller 14 maps each of the physical blocks of the flash memory 16 to one of the block pools, in the BMT 46.

The input block pool 420 includes at least one input block 42. The input block 42 is a block in which data are written. The input block 42 may store no data, or include both a written region and an unwritten region in which data can be written.

The active block pool 430 includes one or more active blocks 43. The active block 43 is a physical block that no longer has a writable region (i.e., becomes full of data). Also, at least some of the written data in the active block 43 are valid data.

The free block pool 440 includes one or more free blocks 44. The free block 44 includes physical blocks that have not stored any data previously and physical blocks that store no valid data. That is, all data stored in the free block 44, if any, have been invalidated.

The bad block pool 450 includes one or more bad blocks 45. The bad block 45 is a block that cannot be used for data writing, for example, because of defects.

FIG. 12 illustrates an example of the block mapping table (BMT) 46 employed in the storage device according to the present embodiment. The BMT 46 includes a free block table 461, an active block table 462, a bad block table 463, and an input block table 464. In each of the tables 461-464 of the BMT 46, each entry indicates correspondence between a block address and an erase count, which indicates a number of times data in the block address have been erased. Other configurations of different types of block pools may be also managed in the BMT 46.

The input block table 464 also indicates a physical page address (PPA) in which next write data are to be written. When the controller 14 remaps a free block 44 in the free block pool 440 as an input block 42, the controller 14 removes a block address of the free block 44 from the free block table 461, and adds a new entry including the block address and PPA=0 to the input block table 464.

Because bad blocks 45 of the flash memory 16 are managed by the controller 14 using the bad block table 463 in the BMT 46 in the present embodiment, the CPU 4 of the host 3 does not have to manage the bad blocks 45 and does not have to monitor unreliable physical blocks and defects of the flash memory 16. If a physical block is determined to be unreliable by the controller 14 of the storage device 2, the controller 14 prevent data from being written into the physical block by deleting an entry of the corresponding block address from one of the input block table 464, the active block table 462, and the free block table 461 that includes the entry and by adding the entry to the bad block table 463. For example, when a program error, an erase error, or an uncorrectable ECC error happens during access to a physical block, the controller 14 determines to remap the physical block as a bad block 45. Because a physical address in which data are to be written is determined by the controller 14, not by the host 3, the host 3 does not need to perform such bad block management.

In addition, because an erase count of each physical block is managed by the controller 14 of the storage device 2 using the BMT 46, the controller 14 may carry out dynamic wear leveling when writing data into the flash memory 16. For example, in the present embodiment, when the controller 14 remaps a free block 44 in the free block pool 440 as an input block 42, the controller 14 selects a free block 44 that has the least erase count. If the free block 44 is located in a channel or a bank that is in a busy state, the controller 14 may select another free block 44 that has the second least erase count and is in an idle state from the free block pool 440.

When the controller 14 processes a write operation with respect to the input block 42, the controller 14 specifies the physical page address (PPA) by referring to the input block table 464, writes data into the physical page address of the input block 42, and increments the PPA in the input block table 464 ((New) PPA=(old) PPA+written data size). When the (new) PPA exceeds maximum page address of the input block 42, the controller 14 re-maps the input block 42 as an active block 43 in the active block pool 430.

Write Operation

Figure 13:
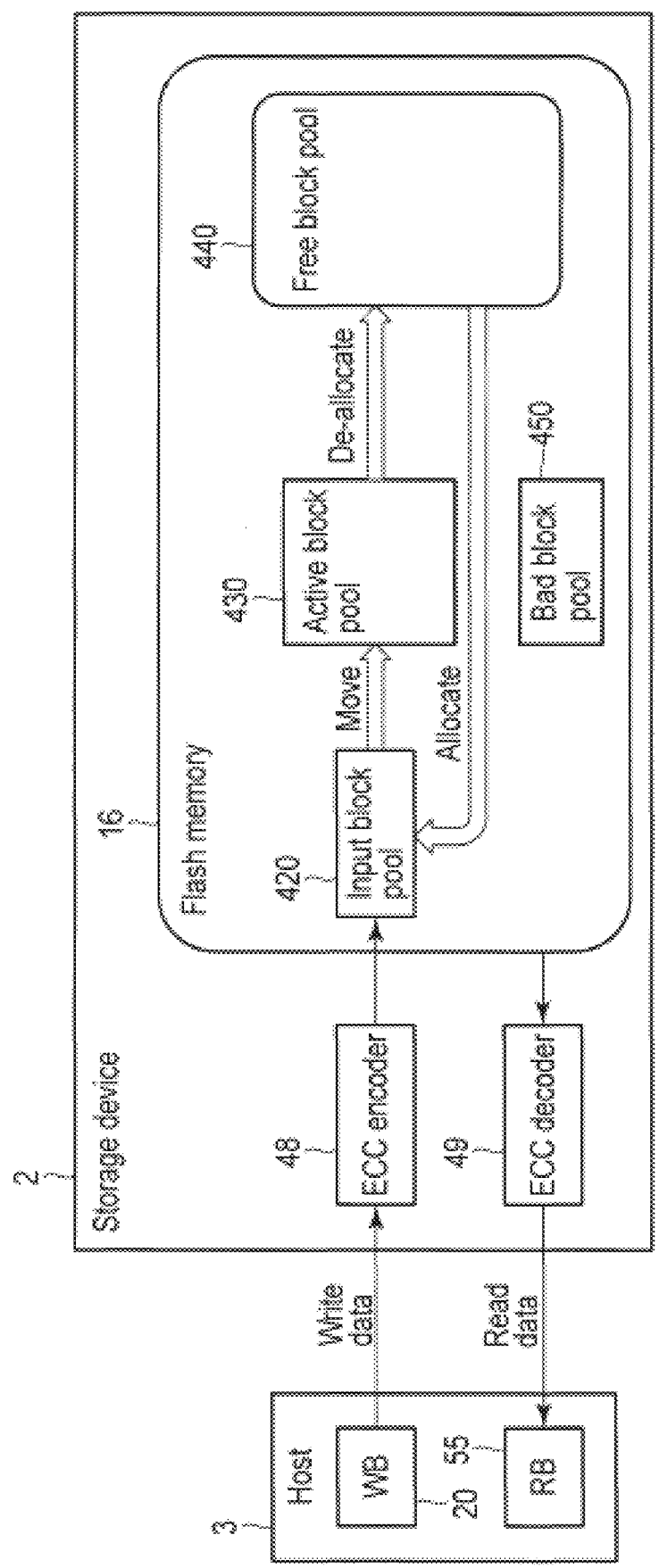
FIG. 13 schematically illustrates a first example of a write operation performed in the storage device according to the embodiment.

FIG. 13 schematically illustrates a first example of a write operation performed in the storage device 2 according to the present embodiment. In the write operation, the controller 14 writes write data (user data) stored in the write buffer memory 20 into the flash memory 16. Each of the input block pool 420, the active block pool 430, the free block pool 440, and the bad block pool 450 in FIG. 14 includes one or more physical blocks.

The controller 14 receives the write data from the write buffer memory 20 via the interface 10 and generates an ECC code from the write data using an ECC encoder 48 of the controller 14. Also, the controller 14 decodes read data, which include the user data and the ECC code, using an ECC decoder 49 in the controller 14 during a read operation described below.

When the controller 14 writes the write data from the write buffer memory 20 into the flash memory 16, the controller 14 specifies physical addresses of pages in the input block 42 of the input block pool 420 into which the write data are to be written by referring to the BMT 46. If there is no available input block 42 in the flash memory 16, the controller 14 allocates a new input block 42 by remapping a free block 44 in the free block pool 440.

In addition, if no physical page in the input block 42 is available for data writing without erasing data therein, i.e., becomes full of written data, the controller 14 remaps the block as an active block 43 in the active block pool 430. The controller 14 may also remap (de-allocate) an active block 43 in the active block pool 430 as a free block 44 in the free block pool 440.

Figure 14:
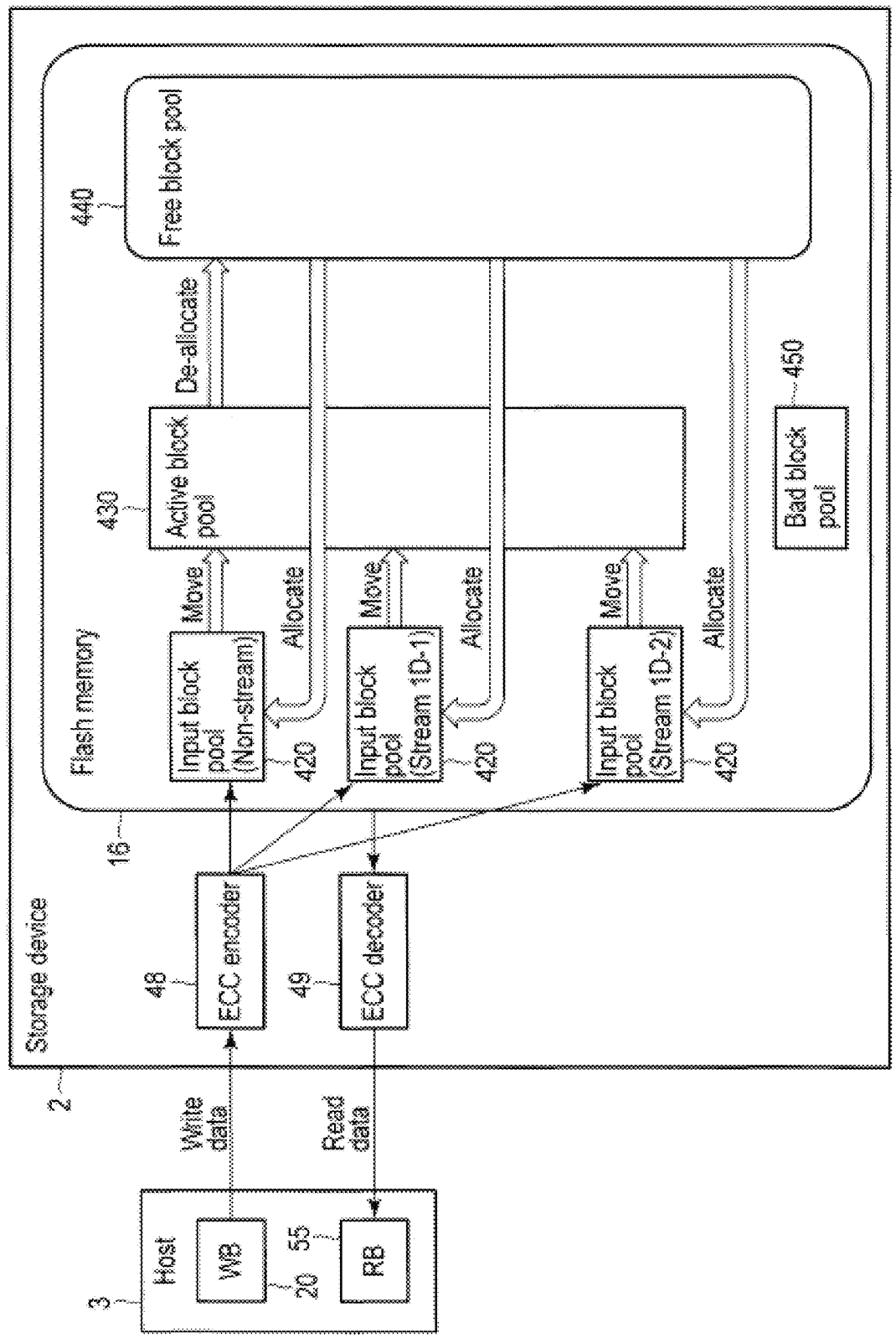
FIG. 14 schematically illustrates a second example of a write operation performed in the storage device according to the embodiment.

FIG. 14 schematically illustrates a second example of the write operation performed in the storage device 2. In this architecture, a plurality of input blocks 42 is prepared in a plurality of input blocks 420, each of which is dedicated for data writing with respect to a corresponding stream ID, and write data associated with a stream ID is written into an input block 42 associated with the stream ID. A write command from the host 3 includes the stream ID in this example. When the OML 12 operates to post the write command specifying a stream ID to the submission queue 50, the controller 14 receives the write data from the write buffer memory 20 and writes the write data into the input block 42 associated with the stream ID. If the OML 12 operates to post a write command which does not specify a stream ID to the submission queue 50, the controller 14 receives the write data from the write buffer memory 20 and writes the write data into an input block 42 associated with no stream ID. By storing write data into different input blocks 42 in accordance with the stream ID, the type of data (or lifetime of data) stored in each input block 42 can be made more uniform, and as a result, entire data in a physical block may be deleted without having to partially transfer the data to another physical block when garbage collection operation is performed, i.e., garbage collection operation becomes more efficient.

Figure 15:
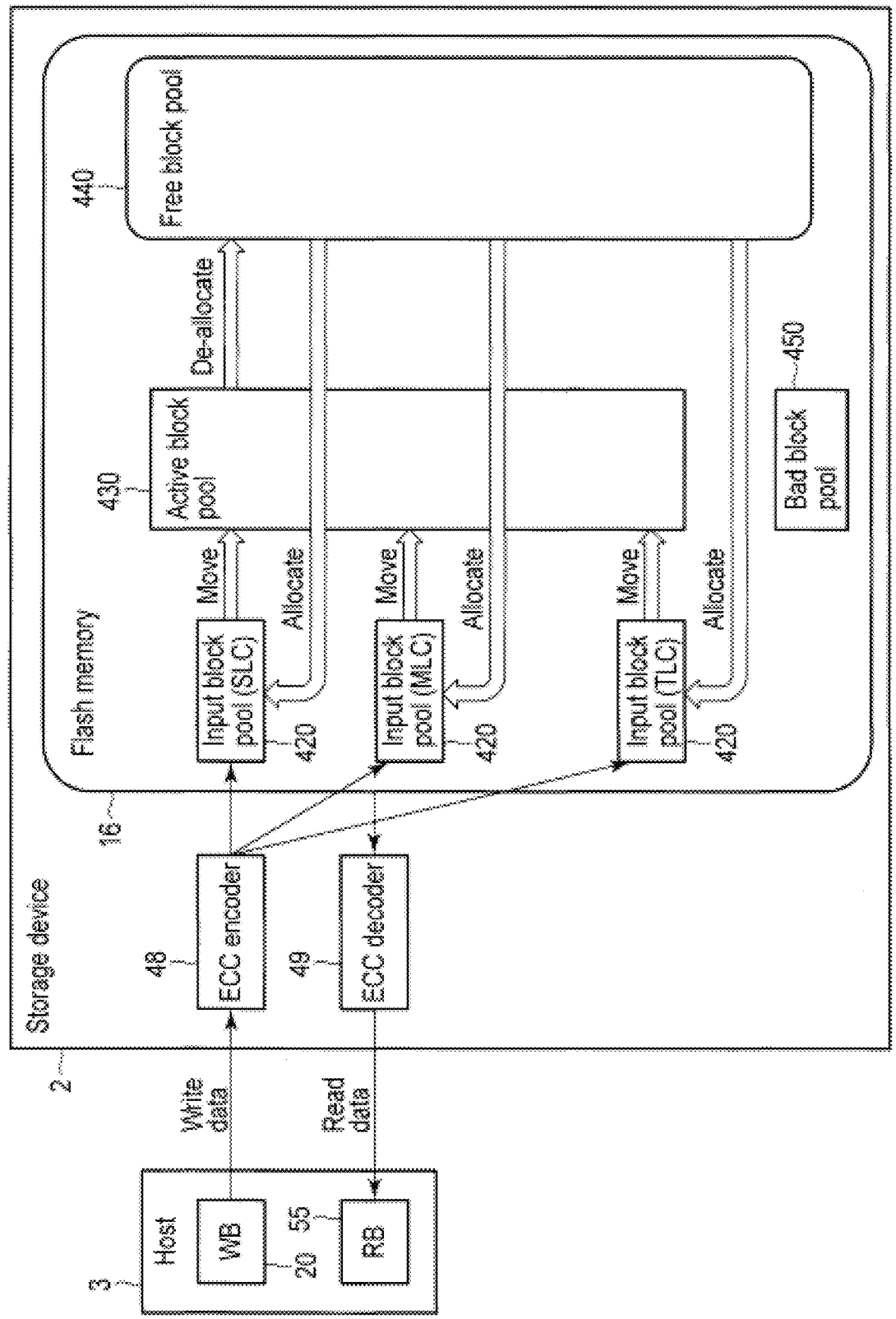
FIG. 15 schematically illustrates a third example of a write operation performed in the storage device according to the embodiment.

FIG. 15 schematically illustrates a third example of the write operation performed in the storage device 2. In this architecture, at least one input blocks 42 is prepared for each different bits-per-cell write systems (SLC, MLC, and TLC), and write data are written into a physical block prepared for in one of SLC, MLC, and TLC. The write command from the host 3 includes a bit density (BD) in this example. If the OML 12 operates to post the write command designating BD=1 to the submission queue 50, the controller 14 receives write data from the write buffer memory 20 and writes, by one-bit-per-cell, the write data into the input block 42 prepared for one-bit-per-cell writing (SLC). If the OML 12 operates to post the write command designating BD=2 to the submission queue 50, the controller 14 receives the write data from the write buffer memory 20 and writes the write data, by two-bits-per-cell, into the input block 42 prepared for two-bits-per-cell writing (MLC). If the OML 12 operates to post the write command designating BD=3 to the submission queue 50, the controller 14 receives the write data from the write buffer memory 20 and writes the write data, by three-bits-per-cell, into the input block 42 prepared for three-bits-per-cell writing (TLC). If the OML 12 operates to post the write command designating BD=0 to the submission queue 50, the controller 14 receives the write data from the write buffer memory 20 and writes the write data, by a predetermined number of bit per cell (one of SLC, MLC, and TLC), into one of the input blocks 42 prepared therefor. Writing data by one-bit-per-cell achieves highest write performance and highest reliability, but lowest data density. Writing data by three-bits-per-cell achieves highest data density, but lowest write performance and lowest reliability. According to the present embodiment, the OML 12 can manage and control a write speed, density, and reliability of the input blocks 420 by determining the value of BD when a write operation is carried out.

Figure 16:
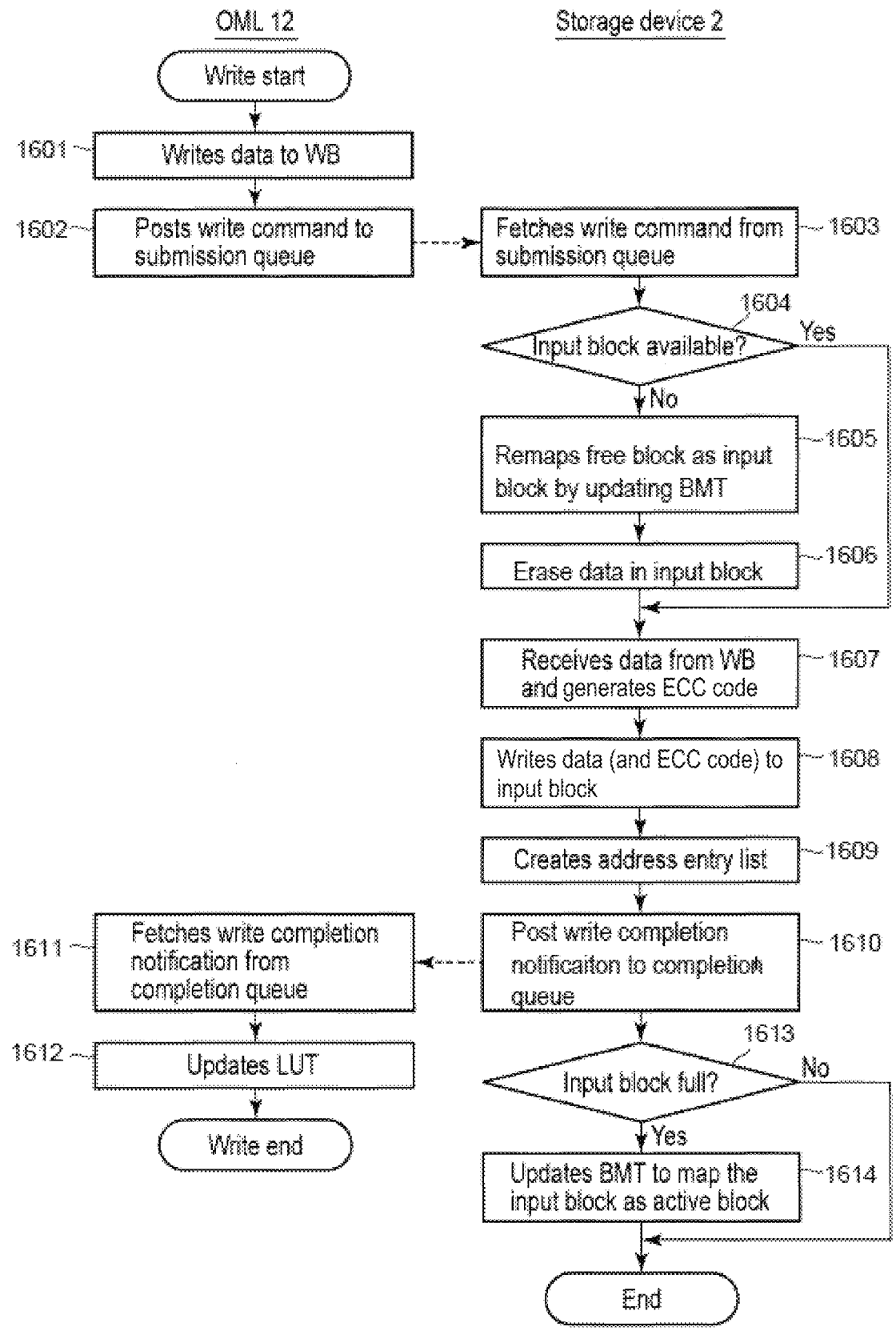
FIG. 16 is a flowchart illustrating a write operation according to an embodiment.

FIG. 16 is a flowchart illustrating a write operation performed by the OML 12 and the storage device 2 (controller 14).

In step 1601, the OML 12 operates to store write data (user data) in the write buffer memory 20 of the host 3. Instead of the write data, a pointer indicating an area of the memory 5 in which the write data have been stored may be stored in the write buffer memory 20.

In step 1602, the OML 12 operates to post a write command to the submission queue 50 in the host 3. The OML 12 operates to include a size of the write data in the write command but does not include a logical and physical address in which the write data are to be written, in the write command.

In step 1603, the controller 14 fetches the write command from the submission queue 50 via the interface 10.

In step 1604, the controller 14 determines whether or not an input block 42 is available for writing the write data. If no input block 42 is available (No in step 1604), the process proceeds to step 1605. If an input block 42 is available (Yes in step 1604), the process proceeds to step 1607.

In step 1605, the controller 14 remaps a free block 44 in the free block pool 440 as a (new) input block 42 by updating the BMT 46.

In step 1606, the controller 14 erases (old) data in the input block 42.

In step 1607, the controller 14 receives the write data from the write buffer memory 20 via the interface 10 and generates an ECC code from the write data using the ECC encoder 48 in the controller 14.

In step 1608, the controller 14 determines a page address(es) of the input block 42 in which the write data (and the ECC code) are to be written by referring to the BMT 46 and writes the write data (and the ECC code) to the specified page addresses of the input block 42.

In step 1609, the controller 14 creates an address entry list including the physical address(es) into which the write data (and the ECC code) have been written through the write operation.

In another embodiment, step 1608 may be performed after step 1609. In this case, in step 1609, the controller 14 creates an address entry list including a physical address(es) into which the write data (and the ECC code) are to be written through the subsequent step 1608.

In step 1610, the controller 14 posts a write completion notification including the address entry list to the completion queue 51 via the interface 10. In another embodiment, in step 1610, the controller 14 may post a write completion notification including a pointer which indicates a physical address of the memory 5 in which the address entry list is stored, after storing the address entry list in the physical address of the memory 5.

In step 1611, the OML 12 operates to fetch the write completion notification from the completion queue 51.

In step 1612, the OML 12 operates to update the LUT 19 by mapping an object ID to the written physical address or addresses included in the received address entry list.

After step 1610, the controller 14 determines whether or not the input block 42 becomes full in step 1613.

If the input block 42 becomes full (Yes in step 1613), the controller 14 updates the BMT 46 to remap the input block 42 as an active block 43 in step 1614. If the input block 42 has not become full (No in step 1613), the process ends.

Read Operation

Figure 17:
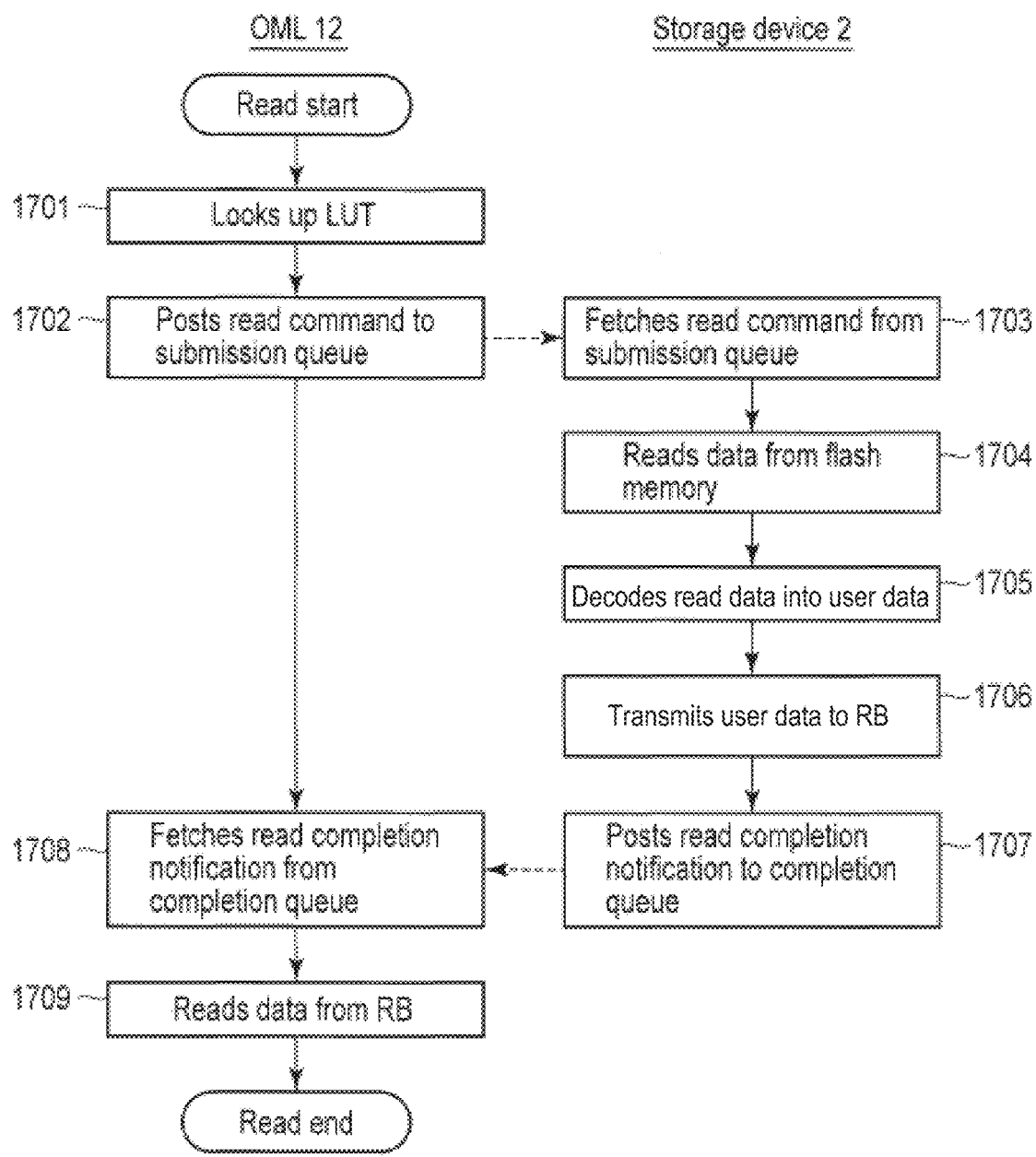
FIG. 17 is a flowchart illustrating a read operation according to an embodiment.

FIG. 17 is a flowchart illustrating a read operation performed by the OML 12 and the storage device 2.

In step 1701, the OML 12 operates to look up the LUT 19 and converts an object ID to one or more physical addresses 56 from which data are to be read.

In step 1702, the OML 12 operates to post a read command to the submission queue 50 in the host 3. The OML 12 operates to include address entries including the physical addresses 56 and a size of the data to be read in the read command.

In step 1703, the controller 14 fetches the read command from the submission queue 50 via the interface 10.

In step 1704, the controller 14 reads data from the physical addresses 56 of the flash memory 16. Here, the controller 14 does not need to specify the physical addresses 56 using the FTL, because the physical addresses 56 are included in the read command.

In step 1705, the controller 14 decodes the read data, which include user data to be read and an ECC code thereof, using the ECC decoder 49 in the controller 14 (See FIGS. 13-15).

In step 1706, the controller 14 transmits the user data to the read buffer memory 55 via the interface 10.

In step 1707, the controller 14 posts a read completion notification to the completion queue 51 via the interface 10.

In step 1708, the OML 12 operates to fetch the read completion notification from the completion queue 51.

In step 1709, the OML 12 operates to read the user data from the read buffer memory 55. Alternatively, the OML 12 may refer to a pointer indicating the user data in the read buffer memory 55 without reading the user data from the read buffer memory 55.

Delete Operation

Figure 18:
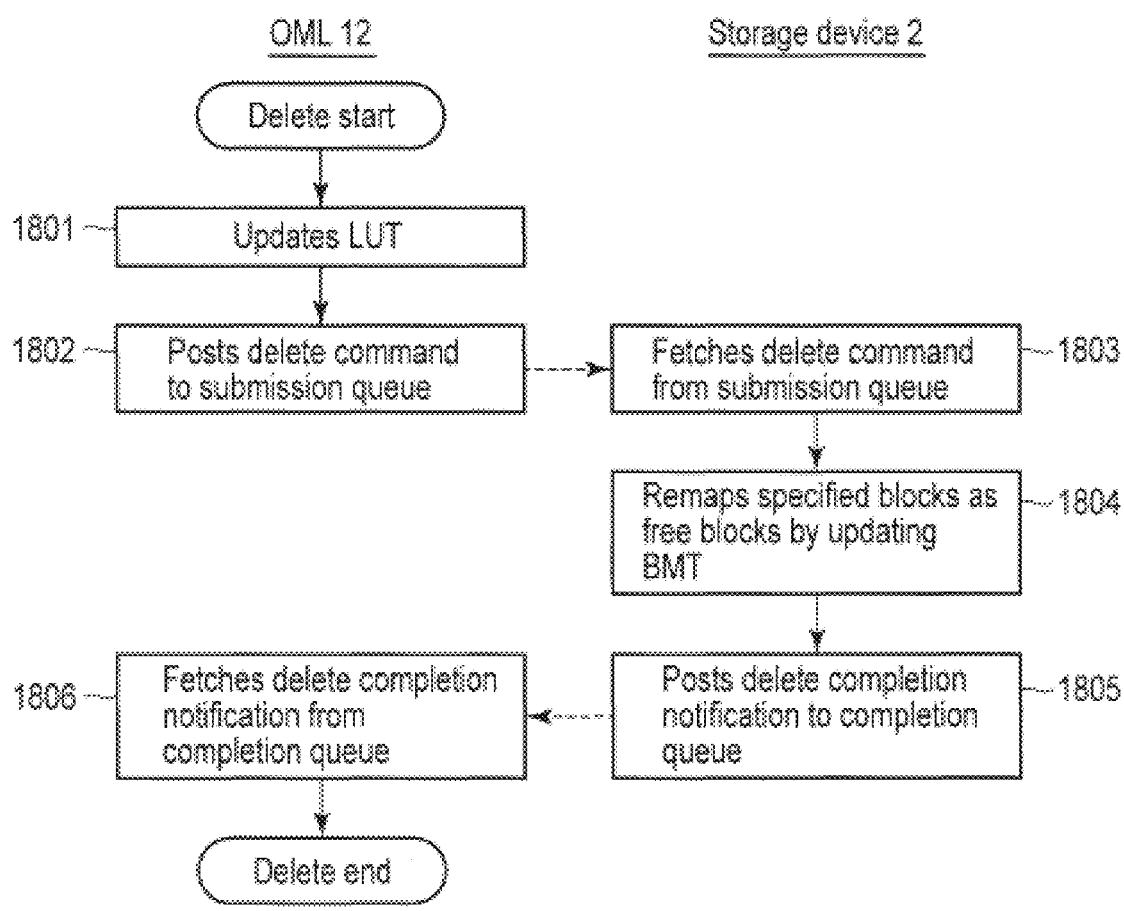
FIG. 18 is a flowchart illustrating a delete operation according to an embodiment.

FIG. 18 is a flowchart illustrating a delete operation performed by the OML 12 and the storage device 2. Through this delete operation, a physical block (an input block 42 or an active block 43) is remapped as a free block 44.

In step 1801, the OML 12 operates to update the LUT 19 to invalidate a mapping to a block to be deleted.

In step 1802, the OML 12 operates to post a delete command to the submission queue 50 in the host 3. The OML 12 operates to include address entries which includes a pair of the chip address (physical chip address) 57 and the block address (physical block address) 58 to be deleted in the delete command (See FIG. 8).

In step 1803, the controller 14 fetches the delete command from the submission queue 50 via the interface 10.

In step 1804, the controller 14 remaps the block to be deleted as a free block 44 by updating the BMT 46, that is, invalidates data in the block to be deleted.

In step 1805, the controller 14 posts a delete completion notification to the completion queue 51 via the interface 10.

In step 1806, the OML 12 fetches the delete completion notification from the completion queue 51.

Copy Operation

Figure 19:
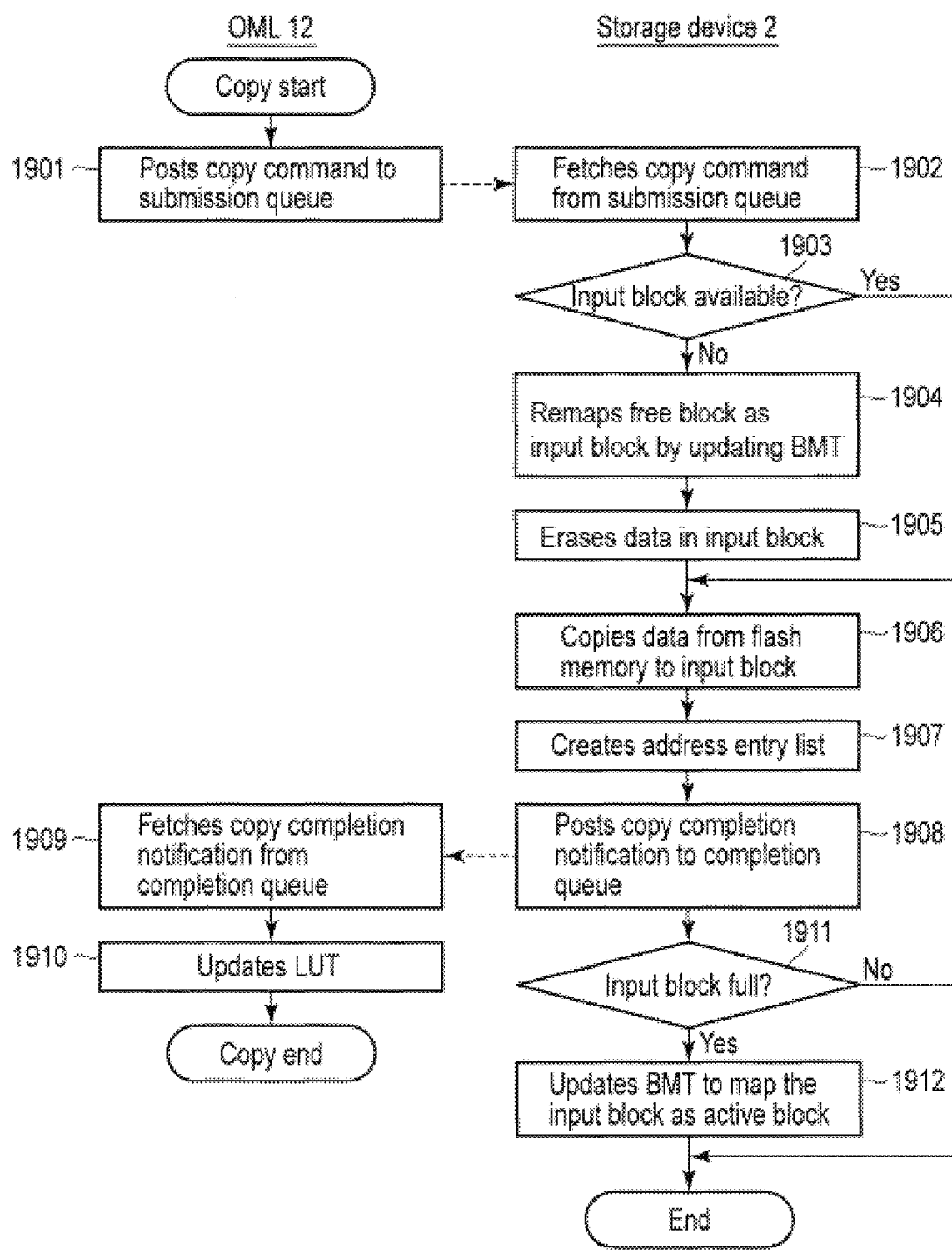
FIG. 19 is a flowchart illustrating a copy operation according to an embodiment.

FIG. 19 is a flowchart illustrating a copy operation performed by the OML 12 and the storage device 2. Through this copy operation, data stored in a physical block of a storage device 2 is moved to another physical block thereof.

In step 1901, the OML 12 operates to post a copy command to the submission queue in the host 3. The OML 12 operates to include address entries including a physical address 56 from which data are to be copied and a size of the data, in the copy command.

In step 1902, the controller 14 fetches the copy command from the submission queue 50 via the interface 10.

In step 1903, the controller 14 determines whether or not an input block 42 is available for writing copied data. If no input block 42 is available (No in step 1903), the process proceeds to step 1904. If there is an available input block 42 (Yes in step 1903), the process proceeds to step 1906.

In step 1904, the controller 14 remaps a free block 44 in the free block pool 440 as an input block 42 by updating the BMT 46.

In step 1905, the controller 14 erases (old) data in the input block 42.

In step 1906, the controller 14 copies data from the physical addresses 56 designated in the copy command to the input block 42 without transferring the data via interface 10. In this step, the controller 14 may decode the data, which include user data and an ECC code thereof by using the ECC decoder 49 in the controller 14 when the controller 14 reads the data, and the controller 14 may generate an ECC code from the user data by using the ECC encoder 48.

In step 1907, the controller 14 creates an address entry list including physical addresses into which the copied data have been written through the copy operation.

In step 1908, the controller 14 posts a copy completion notification including the address entry list to the completion queue 51 via the interface 10.

In another embodiment, in step 1908, the controller 14 may post a copy completion notification including a pointer which indicates a physical address of the memory 5 in which the address entry list is stored, after storing the address entry list in the physical address of the memory 5.

In step 1909, the OML 12 operates to fetch the copy completion notification from the completion queue 51.

In step 1910, the OML 12 operates to update the LUT 19 by remapping an object ID to the physical address into which the copied data have been written.

After step 1910, the controller 14 determines whether or not the input block 42 becomes full in step 1911.

If the input block 42 becomes full (Yes in step 1911), the controller 14 updates the BMT 46 by remapping the input block 42 as an active block 43 in step 1912. If the input block 42 has not become full (No in step 1911), the process ends.

Figure 20:
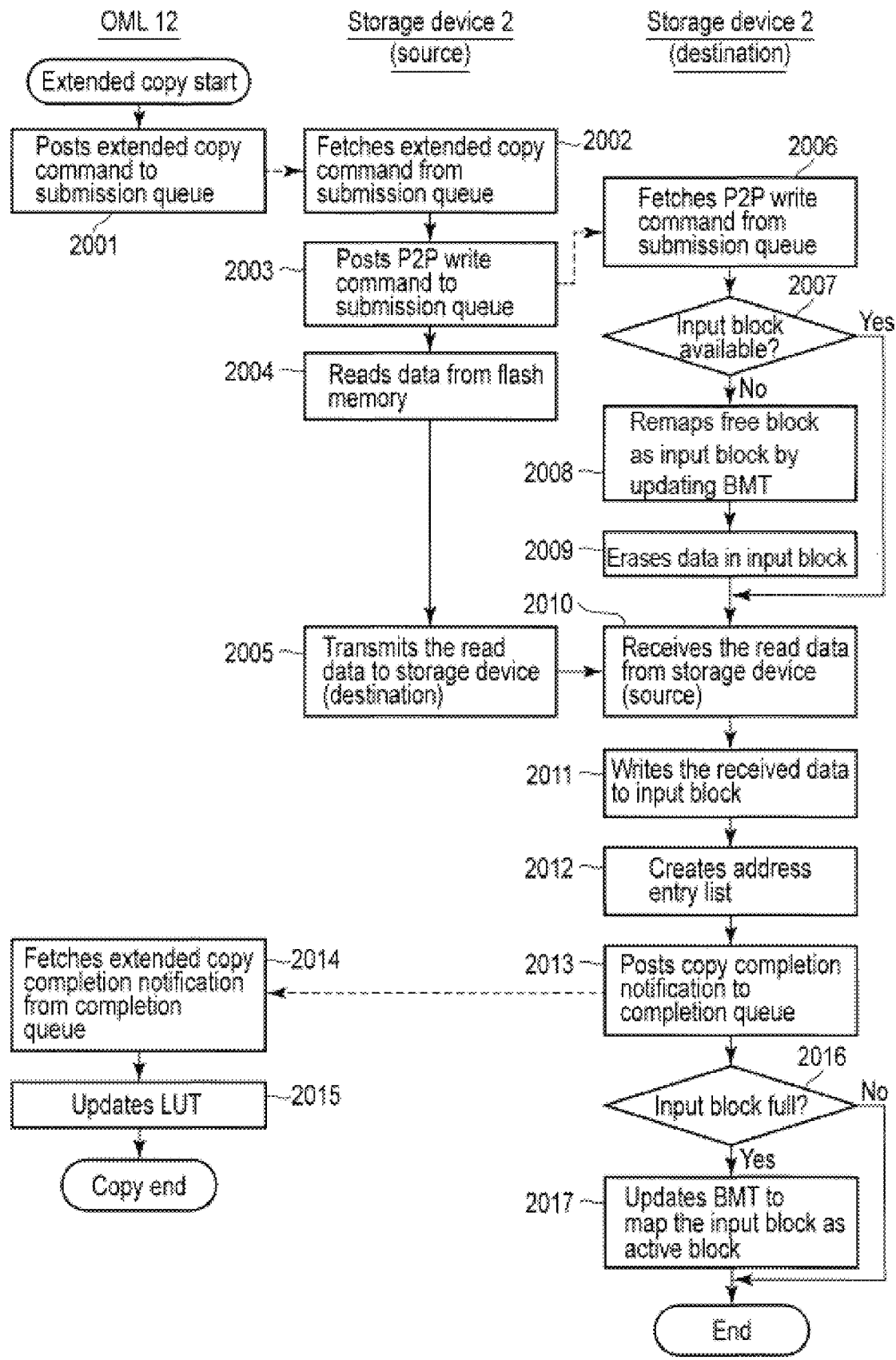
FIG. 20 is a flowchart illustrating an extended copy operation according to an embodiment.

FIG. 20 is a flowchart illustrating an extended copy operation performed by the OML 12 and a plurality of storage devices 2. Through this extended copy operation, data stored in a physical block of a storage device (source storage device) 2 is moved to a physical block of another storage device (destination storage device) 2.

In step 2001, the OML 12 operates to post an extended copy command to the submission queue 50 in the host 3. The OML 12 operates to include a copy destination ID and address entries including a physical address 56 from which data are to be copied and a size of the data, in the extended copy command. The copy destination ID is a unique ID of the destination storage device. In the present embodiment, world wide name (WWN) is used as the copy destination ID, but other unique ID such as a port number, a serial number (SN), IP address, media access control (MAC) address, an extended unique identifier (EUI), or the like can be used.

In step 2002, the controller 14 of the source storage device fetches the extended copy command from the submission queue 50 via the interface 10.

In step 2003, the controller 14 posts a peer-to-peer (P2P) write command to the submission queue 50. The P2P write command includes a size of data to be written.

In step 2004, the controller 14 of the source storage device reads data from the physical address 56 designated in the extended copy command and decodes the read data.

In step 2005, the controller 14 of the source storage device transmits the decoded data (user data) to the destination storage device, which is specified by the copy destination ID in the extended copy command. After that, the process proceeds to step 2010.

After step 2003, the controller 14 of the destination storage device fetches the P2P write command from the submission queue 50 via the interface 10 in step 2006.

In step 2007, the controller 14 of the destination storage device refers to the BMT 46 stored therein, and determines whether or not there is an available input block 42. If an input block 42 is available (Yes in step 2007), the process proceeds to step 2010. If there is no available input block 42 (No in step 2007), the process proceeds to step 2008.

In step 2008, the controller 14 of the destination storage device remaps a free block 44 in the free block pool 440 as an input block 42 by updating the BMT 46.

In step 2009, the controller 14 of the destination storage device erases (old) data in the input block 42.

In step 2010, the controller 14 of the destination storage device receives the copied data from the source storage device and encodes the received copied data.

In step 2011, the controller 14 of the destination storage device writes the encoded copied data into the input block 42.

In step 2012, the controller 14 of the destination storage device creates an address entry list including physical addresses in which the copied data have been written through this extended copy operation.

In step 2013, the controller 14 of the destination storage device 2 posts an extended copy completion notification including the address entry list to the completion queue 51 via the interface 10.

In step 2014, the OML 12 operates to fetch the extended copy completion notification from the completion queue 51.

In step 2015, the OML 12 operates to update the LUT 19 by remapping the object ID to the physical address or addresses of the destination storage device into which the copied data have been written.

After step 2013, the controller 14 of the destination storage device determines whether or not the input block 42 becomes full in step 2016.

If the input block 42 is determined to become full (Yes in step 2016), the controller 14 of the destination storage device updates the BMT 46 by remapping the input block 42 as an active block 43 in step 2017. If the input block 42 is determined to have not become full (No in step 2016), the process ends.

Host-Initiated Power-Off Operation

Figure 21:
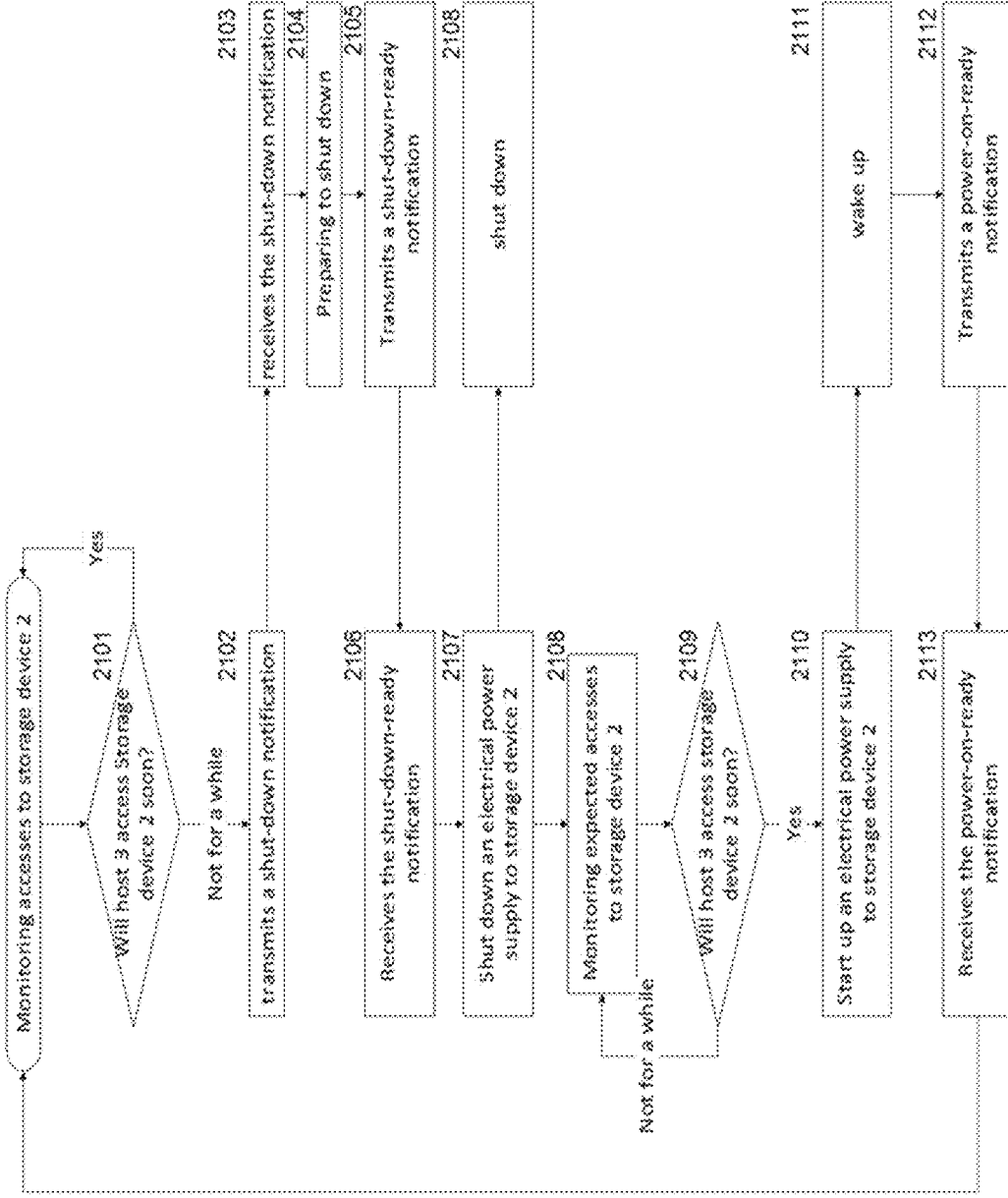
FIG. 21 is a flowchart illustrating a host-initiated power-off operation according to an embodiment.

FIG. 21 is a flowchart illustrating a host-initiated power-off operation performed by the host 3 and the storage device 2 (controller 14). Through this host-initiated power-off operation, the host 3 shuts off power supply to the storage device 2. More specifically, the CPU 4 of the host 3 controls the power supply unit 41 to switch off power supply to the storage device 2. As a result, power consumption by the storage device 2 can be reduced.

In step 2101, the host 3, e.g., the OS 11 or the OML 12 thereof, determines whether or not the host 3 will access the storage device 2 soon (within a predetermined time range). The host 3 predicts expected accesses to the storage device 2, for example, based on operational states of the threads 39 running on the OS 11 and access history with respect to the storage device 2, and so on. If it is determined that the host 3 will access the storage device 2 soon (Yes in step 2101), the process goes back and the host 3 stays standby until a next host-initiated power-off operation starts. The next power-off operation may be initiated by the host 3 after a predetermined time period. If it is determined that the host 3 will not access the storage device 2 soon (No in step 2101), the process proceeds to step 2102.

In step 2102, the host 3 transmits a shut-down notification through the interface 10 to the storage device 2.

In step 2103, the controller 14 of the storage device 2 receives the shut-down notification.

In step 2104, the controller 14 prepares to shut down the storage device 2. For example, if data temporarily stored in the RAM 15, which is volatile memory, should be stored in the flash memory 16, the controller 14 stores the data in an input block 42 through a write operation.

In step 2105, the controller 14, determining that the storage device 2 is ready to be shut down, transmits a shut-down-ready notification through the interface 10 to the host 3.

In step 2106, the host 3 receives the shut-down-ready notification.

In step 2107, the host 3 terminates power supply to the storage device 2. As a result, in step 2108, the storage device 2 and an interface link of the interface 10 are shut down.

In step 2109, the host 3 predicts expected accesses to the storage device 2, for example, based on operational states of the threads 39 running on the OS 11 and access history with respect to the storage device 2, and so on.

In step 2110, the host 3 determines whether or not the host 3 will access the storage device 2 soon (within a predetermined time range). If it is determined that the host 3 will not access the storage device 2 soon (No in step 2110), the process goes back to step 2108. If it is determined that the host 3 will access the storage device 2 soon (Yes in step 2110), the host 3 resumes supplying power to the storage device 2 in step 2111. As a result, in step 2112, the storage device 2 is powered on (wakes up) and the interface link of the interface 10 activated.

In step 2113, the controller 14 of the storage device 2 transmits a power-on-ready notification through the interface 10 to the host 3.

In step 2114, the host 3 receives the power-on-ready notification. After step 2114, the process goes back and the host 3 stays standby until the next host-initiated power-off operation starts.

Host-Initiated Housekeeping Operation

If power-off time of the storage device 2 is excessively long, a data retention error may occur. The data retention error may occur when electrical charges retained in floating gates of the memory cells 33 representing data leak and the data cannot be correctly read.

After memory cells 33 have been programmed to particular levels shown in FIG. 7, the levels may change over time and the levels at the time of data reading may not be the levels at the time of data writing (initial programming). For example, electrical charges that are retained in the floating gates of the memory cells 33 at the time of the initial programming may leak from the floating gates over time. Such leakage of electrical charges may eventually cause a read error that is not correctable by the ECC decoder 49. Such an error is called the data retention error.

To prevent the data retention error, in the present embodiment, a host-initiated housekeeping operation is performed by the host 3 (e.g., the OS 11 or the OML 12) and the controller 14 of the storage device 2. The host-initiated housekeeping operation is initiated when the storage device 2 is powered off.

Figure 22:
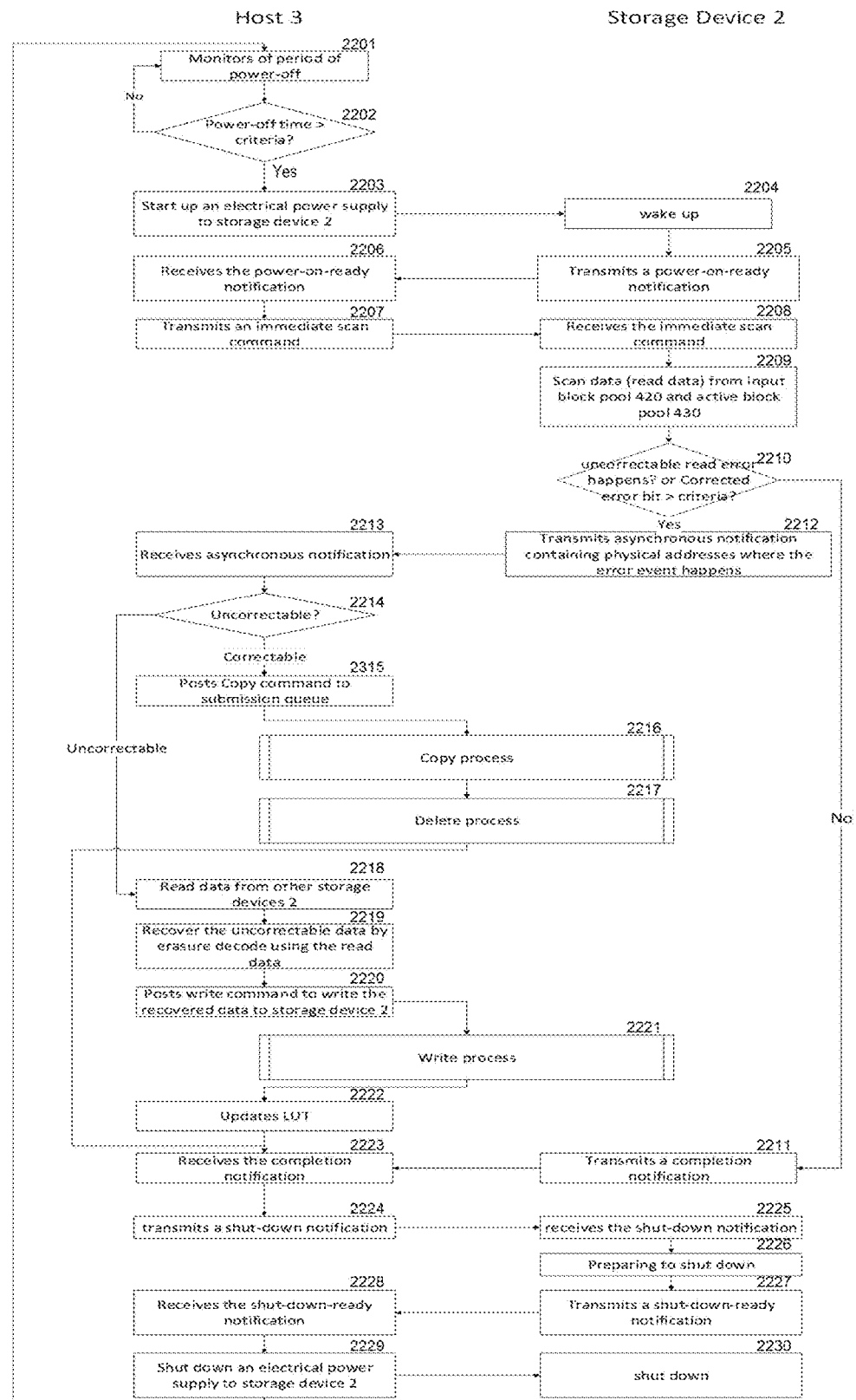
FIG. 22 is a flowchart illustrating a host-initiated housekeeping operation according to an embodiment.

FIG. 22 is a flowchart illustrating a host-initiated housekeeping operation performed by the host 3 and the storage device 2. Through the housekeeping operation, damaged data (data of which level has excessively changed) are recovered through an error correction process and rewritten into the flash memory 16 of the storage device 2.

In step 2201, the host 3 counts a time period during which the storage device 2 is being powered off (shut down).

In step 2202, the host 3 determines whether or not the counted time period is greater than a threshold (criteria). If the determination is negative (No in step 2202), the process goes back to step 2201. If the determination is positive (Yes in step 2202), the process proceeds to step 2203.

In step 2203, the host 3 resumes supplying power to the storage device 2. As a result, in step 2204, the storage device 2 is powered on (wakes up) and the interface link of the interface 10 activated.

In step 2205, the controller 14 of the storage device 2 transmits a power-on-ready notification through the interface 10 to the host 3.

In step 2206, the host 3 receives the power-on-ready notification. In step 2207, the host 3 transmits an immediate scan command through the interface 10 to the storage device 2.

In step 2208, the controller 14 of the storage device 2 receives the immediate scan command. In step 2209, the controller 14 scans data stored in the input block(s) 42 in the input block pool 420 and the active blocks 43 in the active block pool 430. That is, the controller 14 reads valid data from the input block(s) 42 and the active blocks 43 and carries out error correction by decoding the read data using the ECC decoder 49. Here, data may be read from all input block 42 and all active blocks 43. Instead, the immediate scan command may include a parameter designating address ranges of target blocks for the scan and only the target blocks may be scanned.

In step 2210, the controller 14 determines whether or not data are uncorrectable and whether or not the number of error bits that are successfully corrected, if so, is greater than a threshold (criteria). If the determination is negative, i.e., the data are correctable and the number of error bits that are successfully corrected is not greater than the threshold (No in step 2210), the process proceeds to step 2211. If the determination is positive, i.e., the data are uncorrectable or the number of error bits that are successfully corrected is greater than the threshold (Yes in step 2211), the process proceeds to step 2212.

In step 2211, the controller 14 transmits an error-correction completion notification through the interface 10 to the host 3, determining that no substantive refreshment of the read data is necessary.

In step 2212, the controller 14 transmits an asynchronous notification indicating one or more physical block addresses at which data reading error occurred and the read data, determining that a substantive refreshment of the read data is necessary. Here, the determination in step 2210 and the transmission of the asynchronous notification in step 2212 are typically carried out with each time a unit of data is read and decoded for error correction. In this case, while a transmission of the asynchronous notification is being carried out for a data unit (in step 2212), the scanning of another data unit may be concurrently carried out (in step 2209). Further, in this case, the subsequent steps (step 2211-2223) may be carried out for each data unit. Alternatively, after all target data for the scanning have been scanned in step 2209, the subsequent steps 2210-2223 may be carried out.

In step 2213, the host 3 receives the asynchronous notification and the read data.

In step 2214, the host 3 determines whether or not the error bits were fully correctable on the side of the storage device 2 based on the asynchronous notification. If the determination is positive, that is, the error bits are correctable by the storage device 2, the process proceeds to step 2215. If the determination is negative, that is, the error bits are uncorrectable by the storage device 2, the process proceeds to step 2218.

In step 2215, the host 3 posts a copy command to the submission queue 50 to initiate a copy operation.

In step 2216, the host 3 and the storage device carries out the copy operation (or an extended copy operation) in a manner similar to the one described with reference to FIG. 19 (or FIG. 20). Through this copy operation, the error-corrected data by the storage device 2 are written into an input block 42 of the same storage device 2 (or of another storage device 2 through the extended copy operation).

In step 2217, the host 3 initiates a delete operation in a manner similar to the one described with reference to FIG. 18. Through this delete operation, one or more active blocks 43 (or input block 42) that store the error-containing data are remapped as free blocks 44. That is all data in the blocks are invalidated. Then, the process proceeds to step 2223.

In step 2218, in order to correct the error bits using data (erasure code) stored in other physical blocks of the storage device 2 or other storage devices 2, the host 3 initiates a read operation to read the data from the other physical blocks of the storage device 2 or the other storage devices 2, in a manner similar to the one described with reference to FIG. 17. The erasure code is a set of user data and redundant data such as Reed-Solomon code and single parity code. When the host 3 detects that part of user data is lost, the host 3 can recover the lost data from the rest of the user data and the parity data.

In step 2219, the host 3 carries out host-side error correction (erasure decode) with respect to each data (page data) containing error bits, i.e., data (page data) that have not fully or at all corrected by the storage device 2. Here, the host 3 carries out the host-side error correction using the corresponding data read from other physical blocks of the storage device 2 or the other storage devices 2.

Assuming that the data are successfully corrected through the host-side error correction, in step 2220, the OML 12 of the host 3 posts a write command to the submission queue 50 to write the error-corrected data into one of the storage devices 2, which may be the storage device 2 from which the data are read or another storage device 2. This write operation is carried out in a manner similar to the one described with reference to FIG. 17. If the data are not fully correctable even through the host-side error correction, the process may proceed to step 2224 (not shown in FIG. 22).

In step 2222, the host 3 updates the LUT 19 in a manner similar to step 1612. That is, a mapping to an object ID of data to physical addresses into which the data are written is stored in the LUT 19.

In step 2223, the host 3 fetches the error-correction completion notification when step 2211 is carried out, the delete completion notification when step 2217 is carried out, and the write completion notification when step 2221 is carried out.

Thereafter, the host 3 and the storage device 2 carry out steps 2224 to 2230 in a manner similar to steps 2102 to 2108 carried out in the power-off operation (See FIG. 21). After step 2229, the process goes back to step 2201, and the host 3 stays standby until a next host-initiated refresh operation is carried out.

By carrying out the host-initiated housekeeping operation, data that are going to become unreadable soon, i.e., data of which error bits are increasing and going to become uncorrectable soon, are recovered (error-corrected) and the recovered data are written into an input block 42. Through the host-initiated housekeeping operation, the data retention error can be suppressed for a certain period of time. Further, by periodically carrying out the host-initiated housekeeping operation, the data retention error can be suppressed for a longer period of time.

Static Wear Leveling Operation

In some occasions, the storage device 2 may store data that are not frequently accessed by the host 3. Generally, such infrequently-accessed data are referred to as cold data, and a storage device that stores such cold data is referred to as cold storage. Such cold data usually remain in the active blocks 43, because overwriting of the cold data are rarely carried out and thus infrequently invalidated. Thus, the erase counts of the active blocks 43 that store cold data tend to be low. On the other hand, the erase counts of the free blocks 44 tend to be high, because such free blocks 44 are more likely to have stored hot data, which are frequently accessed data.

To make the erase counts of the physical blocks of the flash memory 16 more uniform, a static wear leveling operation is performed by the host 3 (e.g., the OS 11 or the OML 12) and the controller 14 of the storage device 2. The wear leveling operation may be initiated by the host 3 (host-initiated static wear leveling operation) and by the storage device 2 (device-initiated static wear leveling operation). These static wear leveling operations are initiated typically when the storage device 2 is powered on.

Figure 23:
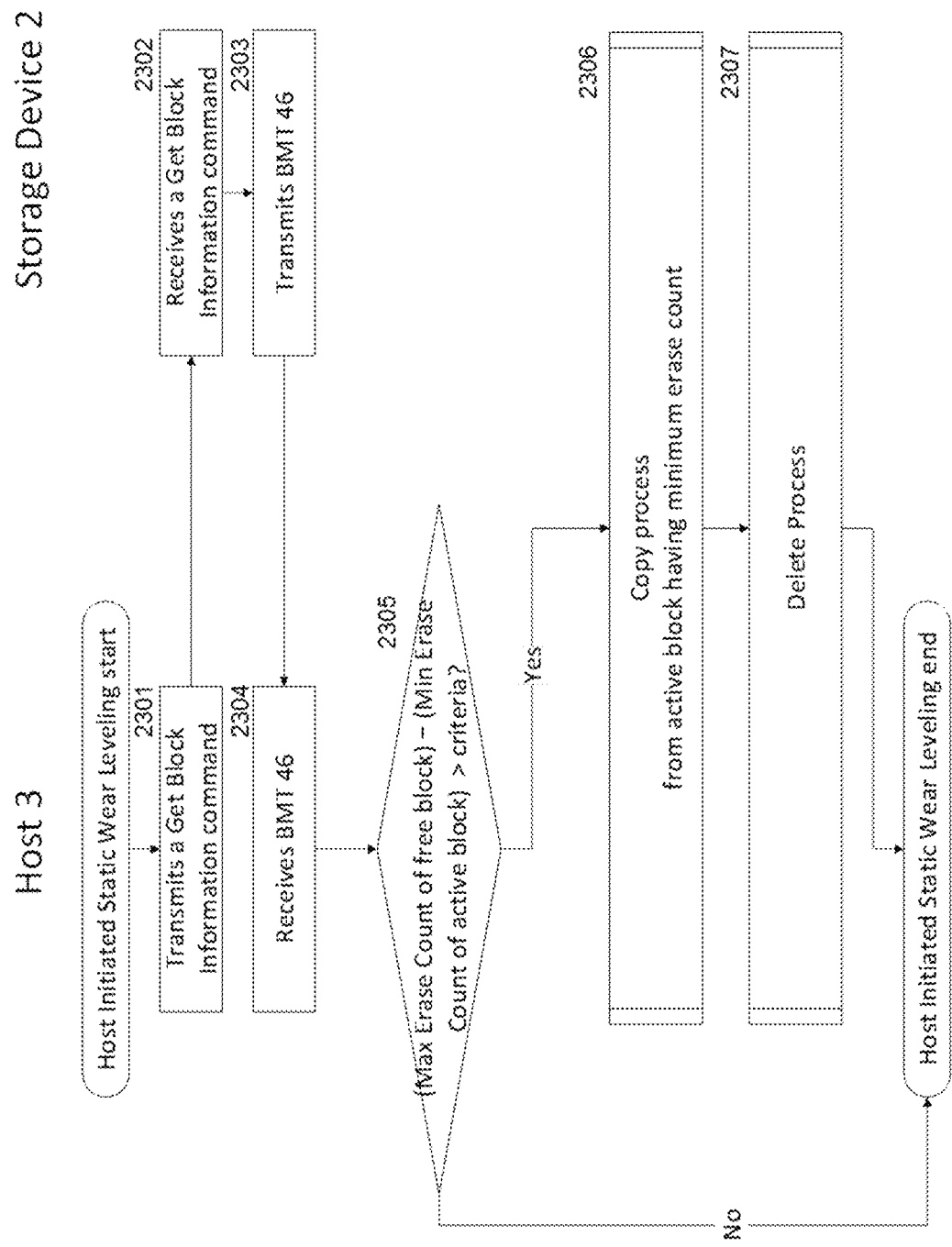
FIG. 23 is a flowchart illustrating a host-initiated static wear leveling operation according to an embodiment.

FIG. 23 is a flowchart illustrating a host-initiated static wear leveling operation performed by the host 3 and the storage device 2. Through the host-initiated static wear leveling operation, cold data stored in an active block(s) 43 are moved to a free block(s) 44.

In step 2301, the host 3 transmits a get block information command through the interface 10 to the storage device 2, in order to obtain block mapping information.

In step 2302, the controller 14 of the storage device 2 receives the get block information command. Then, in step 2303, the controller 14 transmits the BMT 46 (See FIG. 12) through the interface 10 to the host 3.

In step 2304, the host 3 receives the BMT 46. By referring to the BMT 46, in particular the free block table 461 and the active block table 462, the host 3 can recognize active blocks 43 having low erase counts and free blocks 44 having high erase counts.

In step 2305, the host 3 determines whether or not a difference between the highest erase count among the free blocks 44 and the lowest erase count among the active blocks 43 is greater than a predetermined threshold (criteria). If the determination is negative (No in step 2305), the host-initiated static wear leveling operation ends. If the determination is positive (Yes in step 2305), the process proceeds to step 2306.

In step 2306, the host 3 initiates a copy operation to move data (cold data) stored in the active block 43 having the lowest erase count to the free block 44 having the highest erase count. Alternatively, data (cold data) stored in active blocks 43 having erase counts that are lower than a predetermined value (value A) may be moved to free blocks 44 having erase counts that are higher than a predetermined value (value B (B>A)).

This copy operation may be carried out by the host 3 and the storage device 2 in a manner similar to the one described with reference to FIG. 19. If the free block(s) 44 to which the cold data are moved belong to a storage device 2 different from the storage device 2 to which the active block(s) 43 belong, an extended copy operation may be carried out in a manner similar to the one described with reference to FIG. 20.

Normally, the free block(s) 44 selected to write copied data therein during the copy operation described in FIG. 19 and the extended copy operation described in FIG. 20 is a free block(s) 44 having a smaller erase count among all free blocks 44 in the free block pool 440. In a usual write operation and a copy operation, it is preferable to copy the data to free blocks 44 having lower erase counts, in order to make erase counts among the physical blocks more uniform (dynamic wear leveling). In contrast, during the copy operation or the extended copy operation in step 2306 in the static wear leveling operation, the free blocks 44 having higher erase counts are selected as a copy destination in order to make erase counts of the physical blocks more uniform because the copied data will not be overwritten frequently.

In step 2307, the host 3 initiates a delete operation to remap the active block(s) 43 that stores the cold data as a free block(s) 44, i.e., invalidate the cold data stored in the active block(s) 43. This delete operation may be carried out in a manner similar to the one described with reference to FIG. 18.

Through the copy operation (or extended copy operation) in step 2306 and the delete operation in step 2307, the controller 14 of the storage device 2 updates the BMT 46 thereof, by remapping the free block(s) 44 into which the cold data are written as an active block(s) 43 and the active block(s) 43 from which the cold data are read as a cold block(s) 44.

The host 3 can initiate this host-initiated static wear leveling operation periodically or in response to a certain event (e.g., when the host 3 recognizes that certain data are little updated).

Figure 24:
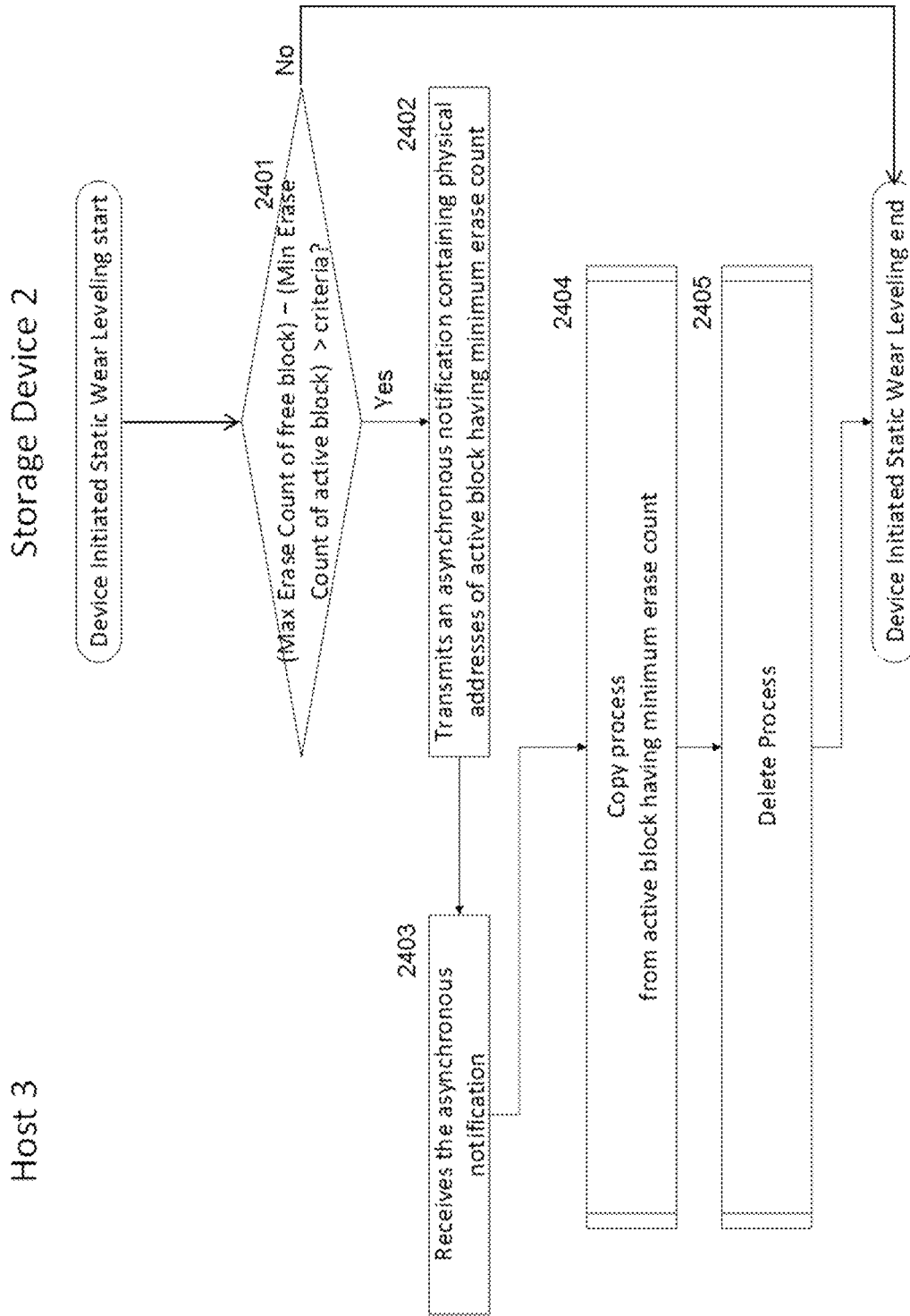
FIG. 24 is a flowchart illustrating a device-initiated static wear leveling operation according to an embodiment.

FIG. 24 is a flowchart illustrating a device-initiated static wear leveling operation performed by the host 3 and the storage device 2. Through the device-initiated static wear leveling operation, cold data stored in an active block(s) 43 are moved to a free block(s) 44.

In step 2401, the controller 14 of the storage device 2, by referring to the BMT 46, determines whether or not a difference between the highest erase count among the free blocks 44 and the lowest erase count among the active blocks 43 is greater than a predetermined threshold (criteria). If the determination is negative (No in step 2401), the device-initiated static wear leveling operation ends. If the determination is positive (Yes in step 2401), the process proceeds to step 2402.

In step 2402, the controller 14 transmits, through the interface 10 to the host 2, an asynchronous notification containing the physical address of the active block that has the lowest erase count or physical addresses of active blocks that have erase counts lower than a predetermined value.

In step 2403, the host 3 receives the asynchronous notification and recognizes the physical address(es) contained therein.

In step 2404, the host 3 initiates a copy operation (or an extended copy operation), which is carried out by the host 3 and the storage device 2 in a manner similar to the copy operation (or the extended copy operation) carried out in step 2306 during the host-initiated static wear leveling operation.

In step 2405, the host 3 initiates a delete operation, which is carried out by the host 3 and the storage device 2 in a manner similar to the delete operation carried out in step 2307 during the host-initiated static wear leveling operation.

The storage device 2 can initiate this device-initiated static wear leveling operation periodically or in response to a certain event.

According to the above embodiment, through the static wear leveling operations, cold data are copied from the active block having the lowest erase count to a free block. Because such cold data are not frequently overwritten in the storage system 1, the erase count of the block into which the cold data are written is unlikely to increase rapidly. As a result, the erase counts among the physical blocks of the flash memory 16 can become more uniform, and therefore worn levels of the physical blocks can be more equalized.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of controlling a memory system that includes a nonvolatile semiconductor memory, the method comprising:
   transmitting a first response to a host device in response to receiving power supplied from the host device;
   in response to a first command that includes a scan request and that is received from the host device after transmitting the first response, scanning data stored in the nonvolatile semiconductor memory and determining a status of the data stored in the nonvolatile semiconductor memory; and
   transmitting to the host device, a second response including the determined status of the data stored in the nonvolatile semiconductor memory.

2. The method according to claim 1, wherein the scan request includes an immediate scan command, the method further comprising:
   scanning the data stored in the nonvolatile semiconductor memory immediately upon receipt of the first command.

3. The method according to claim 1, further comprising:
   including in the first response, a power-on-ready notification.

4. The method according to claim 1, further comprising:
   including in the second response, information indicating whether a data reading error has occurred.

5. The method according to claim 4, wherein the data reading error has occurred, the method further comprising:
   including in the information in the second response, address information indicating an address at which the data reading error has occurred.

6. The method according to claim 4, wherein the data reading error has not occurred, the method further comprising:
   including in the information in the second response, a notification indicating that a refreshment of the data stored in the nonvolatile semiconductor memory is not required.

7. The method according to claim 1, further comprising:
   upon receipt of the first command, reading the data stored in the nonvolatile semiconductor memory.

8. The method according to claim 1, further comprising:
   in response to the first command, scanning data stored in a plurality of input blocks of an input block pool, wherein each of the input blocks includes a region for writing data to.

9. The method according to claim 1, further comprising:
   in response to the first command, scanning data stored in a plurality of active blocks of an active block pool, wherein each of the active blocks includes valid data, and none of the active blocks include a region for writing data to.

10. The method according to claim 1, further comprising:
    transmitting a third response to the host device in response to receiving a notification to shut down, wherein the third response indicates that the host device may stop supplying the power.

11. A method of controlling a memory system that includes a nonvolatile semiconductor memory and a power supply circuit, the method comprising:
    after being supplied power from the power supply circuit of the memory system, transmitting a first response to a host device, wherein the power supply circuit is separate from the host device, and the power from the power supply circuit is based on power supplied from the host device;
    after receiving a first command that includes a scan request and that is received from the host device after transmitting the first response, scanning data stored in the nonvolatile semiconductor memory and determining a status of the data stored in the nonvolatile semiconductor memory; and
    transmitting to the host device, a second response including the determined status of the data stored in the nonvolatile semiconductor memory.

12. The method according to claim 11, wherein the scan request includes an immediate scan command, the method further comprising:
    scanning the data stored in the nonvolatile semiconductor memory immediately upon receipt of the first command.

13. The method according to claim 11, further comprising:
    including in the first response, a power-on-ready notification.

14. The method according to claim 11, further comprising:
    including in the second response, information indicating whether a data reading error has occurred.

15. The method according to claim 14, wherein the data reading error has occurred, the method further comprising:
    including in the information in the second response, address information indicating an address at which the data reading error has occurred.

16. The method according to claim 14, wherein the data reading error has not occurred, the method further comprising:
  including in the information in the second response, a notification indicating that a refreshment of the data stored in the nonvolatile semiconductor memory is not required.

17. The method according to claim 11, further comprising:
  after receiving the first command, reading the data stored in the nonvolatile semiconductor memory.

18. The method according to claim 11, further comprising:
  after receiving the first command, scanning data stored in a plurality of input blocks of an input block pool, wherein each of the input blocks includes a region for writing data to.

19. The method according to claim 11, further comprising:
  after receiving the first command, scanning data stored in a plurality of active blocks of an active block pool, wherein each of the active blocks includes valid data, and none of the active blocks include a region for writing data to.

20. The method according to claim 11, further comprising:
  transmitting a third response to the host device after receiving a notification to shut down, wherein the third response indicates that the host device may stop supplying power.

* * * * *